(12) United States Patent
Yamamoto et al.

(10) Patent No.: US 9,299,720 B2
(45) Date of Patent: Mar. 29, 2016

(54) SEMICONDUCTOR DEVICE AND MANUFACTURING METHOD THEREOF

(71) Applicant: Renesas Electronics Corporation, Kawasaki-shi, Kanagawa (JP)

(72) Inventors: Yoshiki Yamamoto, Kanagawa (JP); Tetsuya Yoshida, Kanagawa (JP); Koetsu Sawai, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/470,846

(22) Filed: Aug. 27, 2014

(65) Prior Publication Data

US 2015/0179673 A1    Jun. 25, 2015

(30) Foreign Application Priority Data

Dec. 20, 2013    (JP) .................................. 2013-264390

(51) Int. Cl.
| | |
|---|---|
| *H01L 23/58* | (2006.01) |
| *H01L 27/12* | (2006.01) |
| *H01L 21/768* | (2006.01) |
| *H01L 27/11* | (2006.01) |
| *H01L 21/66* | (2006.01) |

(52) U.S. Cl.
CPC ...... *H01L 27/1207* (2013.01); *H01L 21/76897* (2013.01); *H01L 22/30* (2013.01); *H01L 27/1104* (2013.01); *H01L 27/1116* (2013.01); *H01L 22/34* (2013.01)

(58) Field of Classification Search
CPC ................. H01L 21/76897; H01L 2223/5448; H01L 22/32; H01L 23/544; H01L 27/11; H01L 27/1207
See application file for complete search history.

(56) References Cited

U.S. PATENT DOCUMENTS

2012/0268159 A1\*   10/2012   Cho et al. ................. 324/762.01
2013/0119470 A1\*   5/2013   Horita et al. .................. 257/347

FOREIGN PATENT DOCUMENTS

| JP | 09-63994 A    | 3/1997 |
| JP | 2003-172766 A | 6/2003 |

OTHER PUBLICATIONS

Zhou et al.; "Characterization of Contact Module Failure Mechanisms for SOI Technology using E-beam Inspection and In-line TEM" ASMC 2010.\*

\* cited by examiner

*Primary Examiner* — Shaun Campbell
(74) *Attorney, Agent, or Firm* — Shapiro, Gabor and Rosenbeger, PLLC

(57) ABSTRACT

When VC inspection for a TEG is performed, it is easily detected whether any failure of a contact plug occurs or not by increasing an emission intensity of a contact plug, so that reliability of a semiconductor device is improved. An element structure of an SRAM is formed on an SOI substrate in a chip region. Also, in a TEG region, an element structure of an SRAM in which a contact plug is connected to a semiconductor substrate is formed on the semiconductor substrate exposed from an SOI layer and a BOX film as a TEG used for the VC inspection.

3 Claims, 21 Drawing Sheets

SEMICONDUCTOR DEVICE AND MANUFACTURING METHOD THEREOF

CROSS-REFERENCE TO RELATED APPLICATION

The present application claims priority from Japanese Patent Application No. 2013-264390 filed on Dec. 20, 2013, the content of which is hereby incorporated by reference into this application.

TECHNICAL FIELD

The present invention relates to a semiconductor device and a method of manufacturing the same, and in particular, the present invention relates to a technique effectively applied to a semiconductor device used for inspection of a contact plug.

BACKGROUND

In semiconductor devices, elimination of the formation defect of a wire, a via, a contact plug and others is an issue in order to obtain high reliability. As the formation defect due to a process caused with a high probability, a defect related to a contact plug is cited. Such a defect is as an embedding defect at a bottom of the contact plug and a defect due to a high resistance because of alteration or others.

When the formation defect of the contact plug is inspected, for example, a method of inspecting conduction between the contact plug and the semiconductor substrate is known, the method using a device formed for the inspection and being performed by irradiating a TEG (Test Elemental Group) including a configuration with connection between the contact plug and the semiconductor substrate with an electron ray. This method is called a VC (Voltage contrast) inspection.

Japanese Patent Application Laid-Open Publication No. H09-63994 (Patent Document 1) describes that a bulk region in which a support substrate is exposed by removing a buried oxide film is provided in a scribe line of a wafer including an SOI (Silicon On Insulator) substrate in order to suppress charge up. This document does not describe provision of an element structure in the bulk region.

Japanese Patent Application Laid-Open Publication No. 2003-172766 (Patent Document 2) describes that the TEG having the same configuration as that of an SRAM (Static Random Access Memory) is formed in the scribe line of the wafer in order to acquire electric characteristics of the SRAM. The Patent Document 2 does not describe usage of the SOI substrate. Also, these Patent Document 1 and Patent Document 2 do not describe provision of the TEG used for the VC inspection.

SUMMARY

When irradiated with the electron ray (electron beam) for the VC inspection, electrons in the semiconductor substrate flow through a correctly-formed contact plug, and therefore, light emission can be verified. On the other hand, no electron flows through a contact plug whose connection to the semiconductor substrate is insufficient, and therefore, the light emission does not occur. Therefore, by checking no light emission at a portion where the contact plug that does not emit light is formed, abnormality of the contact plug can be detected.

When a wafer including an SOI substrate made of a laminated structure of a support substrate, a buried oxide film, and a silicon layer is used, it is considered to form the TEG having a structure in which an element is formed on the SOI substrate and a contact plug is connected to the element. When a VC inspection for the contact plug connected to an upper surface of the SOI substrate as described above is performed, even if the normal contact plug is irradiated with the electron ray, the number of electrons flowing through the contact plug is small because the contact plug is electrically insulated from the support substrate by the buried oxide film, and thus, the contact plug does not emit light. Therefore, even if the VC inspection is performed for an element formed on the SOI substrate, the normal contact plug and the abnormal contact plug cannot be distinguished from each other, and therefore, a problem of reduction in reliability of the semiconductor device arises.

Other preferred aims and novel characteristics will be apparent from the description of the present specification and the accompanying drawings.

The typical summary of the embodiments disclosed in the present application will be briefly described as follows.

A semiconductor device according to an embodiment includes an SRAM on an SOI substrate in a chip region, and also an SRAM on a bulk silicon substrate in a TEG region as TEG for VC inspection, the SRAM having a contact plug connected to a semiconductor substrate.

Also, in a method of manufacturing a semiconductor device according to an embodiment, an SRAM is formed on an SOI substrate in a chip region, and besides, an SRAM having a contact plug connected to a semiconductor substrate is formed as TEG for VC inspection on a bulk silicon substrate in a TEG region.

According to an embodiment disclosed in the present application, reliability of the semiconductor device can be improved.

DETAILED DESCRIPTION

Figure 1:
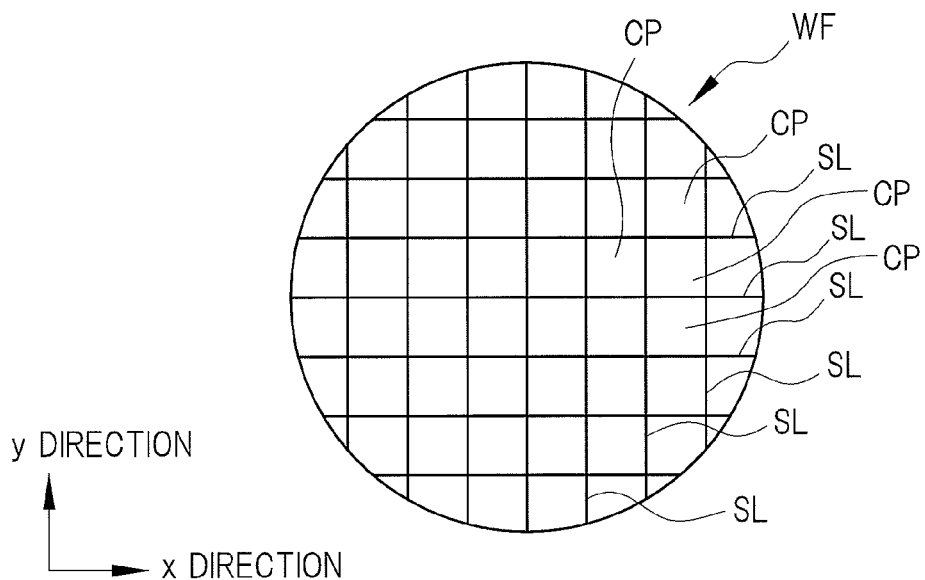
FIG. 1 is a plan view of a semiconductor wafer including a TEG used for a method of inspecting a semiconductor device according to a first embodiment of the present invention.

Hereinafter, embodiments will be described in detail with reference to the accompanying drawings. Note that components having the same function are denoted by the same reference symbols throughout all drawings for describing the embodiments, and the repetitive description thereof will be omitted. Also, in the following embodiments, the description of the same or similar parts will not be repeated unless particularly required.

Also, the SOI substrate in the present application means a substrate having a laminated structure made of a support substrate made of a semiconductor substrate, a BOX (Buried Oxide) film as a buried oxide film on the support substrate, and a silicon film (SOI layer) as a semiconductor layer on the BOX film. And, a region having such a laminated structure inside a semiconductor wafer is called an SOI region.

Further, the bulk region in the present application is a region in which the semiconductor substrate as a support substrate is exposed from the BOX film and the silicon film inside a semiconductor wafer. A semiconductor wafer containing an SOI substrate may include an SOI region and a bulk region. Here, the support substrate exposed from the BOX film in the bulk region may be called a bulk silicon substrate.

Still further, among regions configuring the semiconductor wafer in the present application, a region singulated by a dicing process to be a semiconductor chip is called a chip region, and a region between the chip regions arranged in a matrix form on the semiconductor wafer is called a scribe line or a scribe region. Note that a scribe region which is not cut out by the dicing process and remains in the chip region may be formed.

First Embodiment

A semiconductor device according to the present embodiment relates to a TEG used to inspect a contact plug in the VC inspection. In the VC inspection, the formation defect of the contact plug, that is, whether a substrate leakage defect occurs or not is inspected by, for example, irradiating the contact plug connected to the semiconductor substrate with the electron ray. The substrate leakage defect is a defect in which, in a case of the formation of the contact plug, connection between the contact plug and the semiconductor substrate is not sufficiently secured due to an embedding defect of a metal film or others in a step of forming the contact plug.

When the contact plug that is normally connected to the semiconductor substrate is irradiated with the electron ray for the VC inspection, the contact plug is positively charged, and therefore, the electrons in the semiconductor substrate flow through and are emitted to the contact plug. At this time, the contact plug emits light, and therefore, the light is detected to verify the normal connection of the contact plug to the substrate.

On the other hand, even if the contact plug that is not normally connected to the semiconductor substrate is irradiated with the electron ray, the electrons in the semiconductor substrate does not flow through the contact plug, and therefore, the contact plug does not emit light. Thus, by detecting the contact plug that does not emit light in the VC inspection, the connection defect of the contact plug, that is, the formation defect thereof can be detected. The determination of whether the contact plug is conducted or not is made by, for example, observation of a contrast between light emission (bright portion) of the normal light-emitting contact plug and a non-light-emitting non-conduction contact plug (dark portion) with visually recognizing a pictured image of the contact plug at the inspection.

When a defect of the contact plug is found, manufacturing of a defective product can be prevented by stopping the manufacturing of the semiconductor wafer whose defect has been found, and besides, occurrence of the defect can be prevented by feeding an inspection result back to a subsequent manufacturing step. Accordingly, the reliability of semiconductor devices can be improved.

Figure 2:
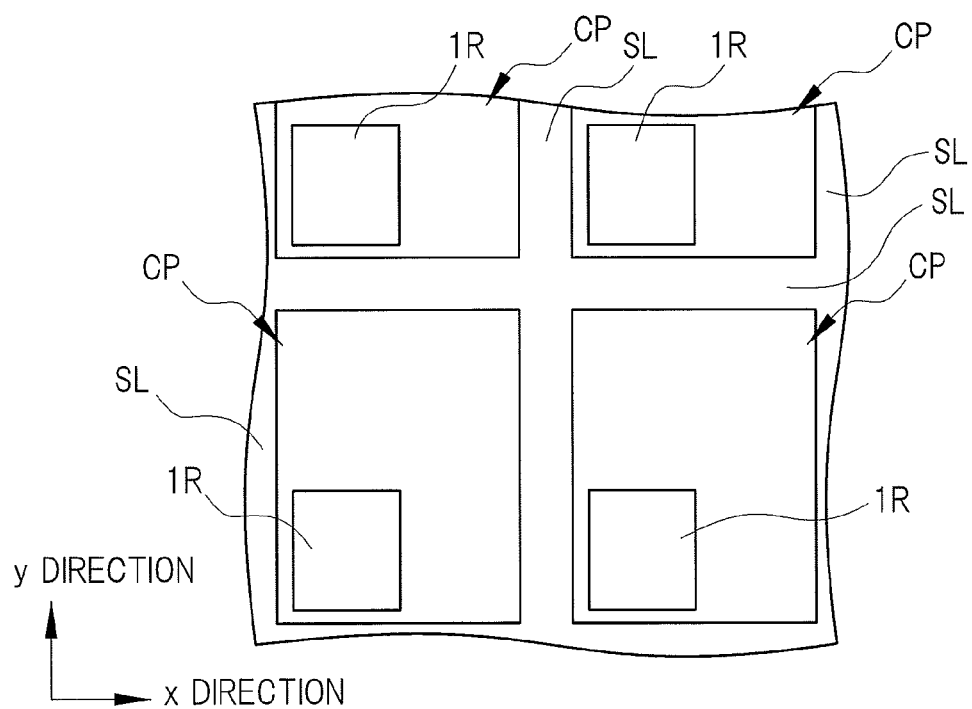
FIG. 2 is a plan view illustrating FIG. 1 which is partially enlarged.
Figure 3:
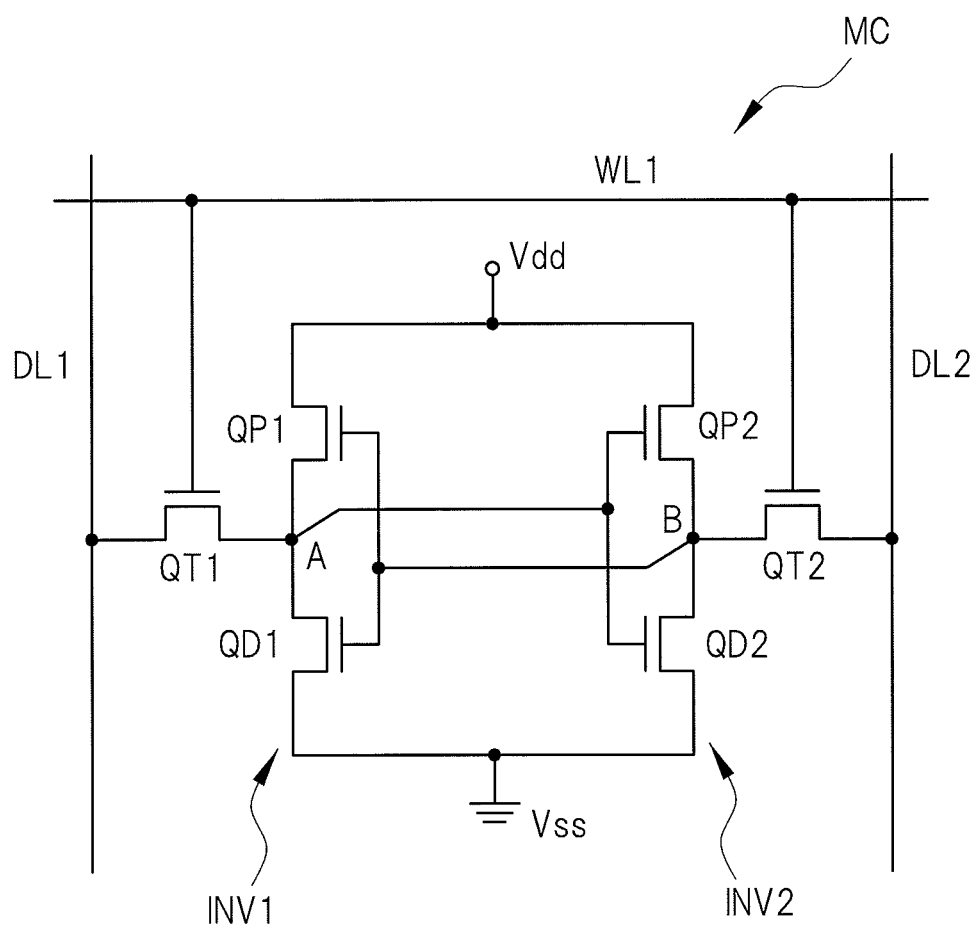
FIG. 3 is an equivalent circuit diagram of an SRAM according to the first embodiment of the present invention.
Figure 4:
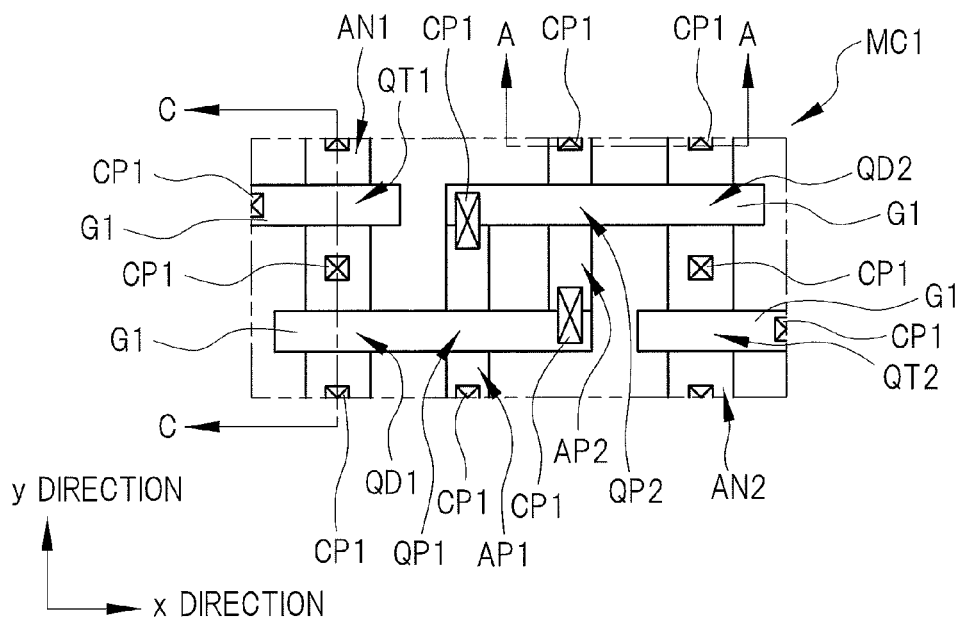
FIG. 4 is a plane layout illustrating FIG. 2 which is partially enlarged.
Figure 5:
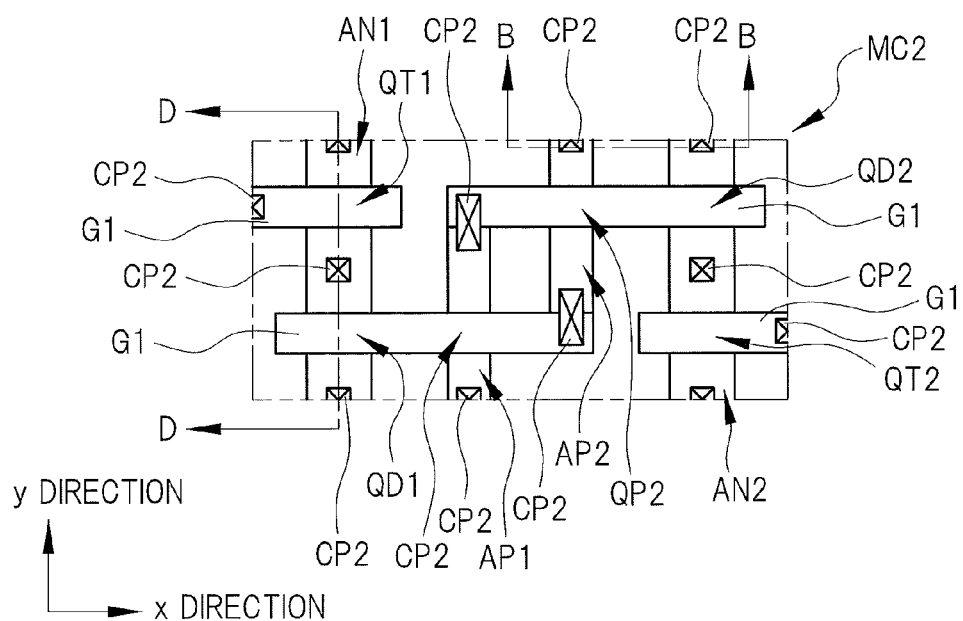
FIG. 5 is a plane layout illustrating FIG. 2 which is partially enlarged.
Figure 6:
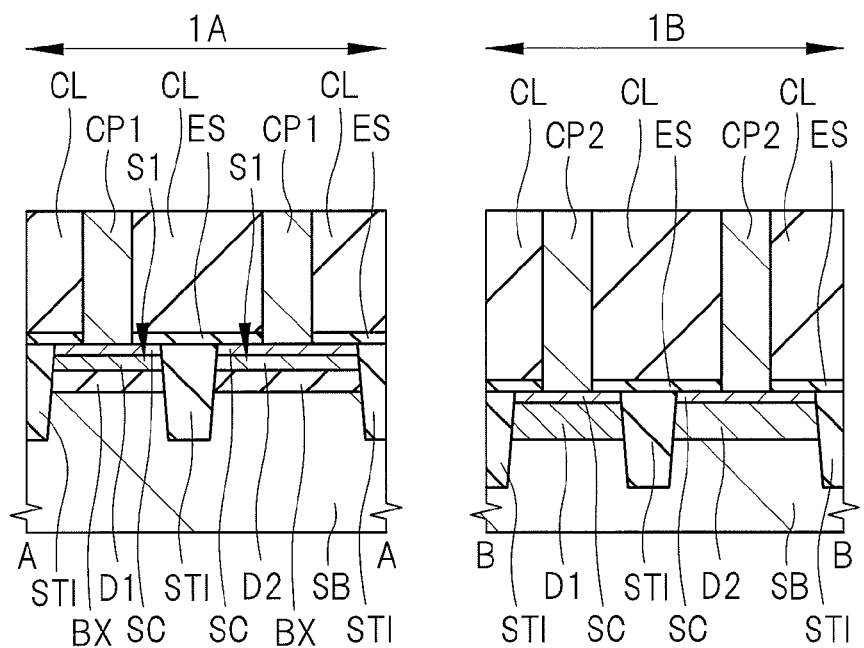
FIG. 6 is a cross-sectional view of the semiconductor device according to the first embodiment of the present invention.

The present embodiment has such a feature as forming a TEG with an SRAM structure in which the SRAM is formed on an SOI substrate in a chip region of a semiconductor wafer and in which the contact plug is connected onto a bulk silicon substrate in the scribe region of the semiconductor wafer, so that the reliability of the semiconductor device is improved by the feature. Hereinafter, with reference to FIGS. 1 to 6, the structure of the semiconductor device according to the present embodiment will be described. FIG. 1 is a plan view of a semiconductor wafer including the semiconductor device according to the present embodiment. FIG. 2 is a plan view illustrating FIG. 1 which is partially enlarged. Also, FIGS. 4 and 5 are plane layouts illustrating FIG. 2 which is partially enlarged. FIG. 3 is an equivalent circuit diagram of the SRAM of the present embodiment. FIG. 6 is a cross-sectional view including a cross section along a line A-A in FIG. 4 and a cross section along a line B-B in FIG. 5.

FIG. 1 illustrates a plan view of a semiconductor wafer WF including the semiconductor device according to the present embodiment. As illustrated in FIG. 1, on a principal surface of the semiconductor wafer WF having a circular shape when seen in a plan view, a plurality of scribe lines SL extending in a "y" direction along the principal surface of the semiconductor wafer WF and in an "x" direction along the principal surface of the semiconductor wafer WF which is perpendicular to the y direction are formed. A plurality of the scribe lines SL extending in the y direction are arranged to be aligned in the x direction, and a plurality of the scribe lines SL extending in the x direction are arranged to be aligned in the y direction. That is, the plurality of scribe lines SL are arranged in a grid form.

The principal surface of the semiconductor wafer WF has a plurality of chip regions CP arranged thereon in a matrix form to be partitioned by the scribe lines SL. Each of the plurality of chip regions CP arranged in the y direction and the x direction has a rectangular shape when seen in a plan view. That is, the chip region CP is a region surrounded by the scribe lines SL on the principal surface of the semiconductor wafer WF. Here, the semiconductor wafer WF includes a support substrate, a BOX film on the support substrate, and a silicon layer on the BOX film.

Next, FIG. 2 illustrates a plan view in which a region in periphery of the chip regions CP is enlarged. As illustrated in FIG. 2, the plurality of chip regions CP are arranged in an array form, and the chip regions CP which are adjacent to each other in the y direction or the x direction are partitioned by the scribe line SL. The scribe line SL, that is, the scribe region is a region cut out by a dicing blade in a dicing process during the formation process of the semiconductor chip. The chip region CP is a region to become the semiconductor chip by being singulated by the dicing process which is a region remaining on the product.

The chip region CP partially has an SRAM region 1R as a region where the SRAM used as a storage element is formed. The SRAM is a volatile memory used for temporarily storing information, and is formed of a flip-flop circuit obtained by combining a plurality of transistors. The SRAM includes four or six MOSFETs (Metal Oxide Semiconductor Field Effect Transistors) in some cases, and the SRAM including the six MOSFETs will be described in the present embodiment. However, even if the SRAM including the four MOSFETs is formed in the SRAM region 1R, the TEG in the present embodiment can be applied. The TEG according to the present embodiment described later is formed on the scribe line SL.

Hereinafter, the SRAM will be described. First, FIG. 3 illustrates an equivalent circuit of one memory cell MC configuring the SRAM. As illustrated in FIG. 3, the memory cell MC is arranged at an intersection between a word line WL1 and a data line DL1 and a data line DL2 which are a pair of complementary data lines, that is, a pair of bit lines, and includes a drive transistor, a load transistor, and a transfer transistor. That is, the memory cell MC of the SRAM includes a pair of drive MOSFETs QD1 and QD2, a pair of load MOSFETs QP1 and QP2, and a pair of transfer MOSFETs QT1 and QT2. Each of the drive MOSFETs QD1 and QD2 and the transfer MOSFETs QT1 and QT2 is formed of an n-channel MOSFET, and each of the load MOSFETs QP1 and QP2 is formed of a p-channel MOSFET.

The drive MOSFET QD1 and the load MOSFET QP1 among the six MOSFETs configuring the memory cell MC configures a CMOS (Complementary Metal Oxide Semiconductor) inverter INV1, and the drive MOSFET QD2 and the load MOSFET QP2 among them configure a CMOS inverter INV2. Accumulation nodes A and B which are input/output terminals shared by the pair of these CMOS inverters INV1 and INV2 are cross-linked to configure a flip-flop circuit as an information storage unit used for storing 1-bit information. Also, the accumulation node A which is one input/output terminal of the flip-flop circuit is connected to one of source/drain regions of the transfer MOSFET QT1, and the accumulation node B which is the other input/output terminal of the flip-flop circuit is connected to one of source/drain regions of the transfer MOSFET QT2.

Further, the other of the source/drain regions of the transfer MOSFET QT1 is connected to the data line DL1, and the other of the source/drain regions of the transfer MOSFET QT2 is connected to the data line DL2. In addition, one end of the flip-flop circuit, that is, each source region of the load MOSFETs QP1 and QP2 is connected to a power supply voltage Vdd, and the other end thereof, that is, each source region of the drive MOSFETs QD1 and QD2 is connected to a reference voltage Vss.

In description of an operation of the above-described circuit, when the accumulation node A of the one CMOS inverter INV1 is at a high potential (H), the drive MOSFET QD2 is turned on, and therefore, the accumulation node B of the other CMOS inverter INV2 is at a low potential (L). Therefore, the drive MOSFET QD1 is turned off, and the high potential (H) of the accumulation node A is maintained. That is, states of the shared accumulation nodes A and B is maintained by a latch circuit obtained by cross-linking the pair of the CMOS inverters INV1 and INV2, so that information is stored while the power supply voltage is applied.

The word line WL1 is connected to each gate electrode of the transfer MOSFETs QT1 and QT2, and the conduction/non-conduction of the transfer MOSFETs QT1, QT2 is controlled by the word line WL1. That is, when the word line WL1 is at a high potential (H), the transfer MOSFETs QT1, QT2 are turned on so as to electrically connect between the latch circuit and the complementary data lines (data lines DL1, DL2), and therefore, potential states (H or L) of the accumulation nodes A, B are shown in the data lines DL1, DL2, and are read as information of the memory cell MC.

In a read operation, a current flows from the data line DL1 to the accumulation node A in the transfer MOSFET QT1, and a current flows from the data line DL2 to the accumulation node B in the transfer MOSFET QT2. That is, as active regions of the transfer MOSFETs QT1, QT2 in the reading, the accumulation nodes A, B side becomes the source region, and the data lines DL1, DL2 side becomes the drain region.

In order to write information into the memory cell MC, information in the data lines DL1, DL2 is transmitted to the accumulation nodes A, B with a state of the word line WL1 at the (H) potential level and the transfer MOSFETs QT1, QT2 in the ON state. In this write operation, a current flows from the accumulation node A to the data line DL1 in the transfer MOSFET QT1, and a current flows from the accumulation node B to the data line DL2 in the transfer MOSFET QT2. That is, as active regions of the transfer MOSFETs QT1, QT2 in the writing, the data lines DL1, DL2 side becomes the source region, and the accumulation nodes A, B side becomes the drain region. In this manner as described above, the SRAM can be operated.

Next, the layout configuration of the SRAM according to the present embodiment will be described. FIG. 4 illustrates a plane layout of one memory cell MC1, that is, a first memory cell configuring the SRAM formed in the SRAM region 1R (see FIG. 2). The memory cell MC1 of the SRAM includes six field effect transistors such as the pair of drive MOSFETs QD1, QD2, the pair of load MOSFETs QP1, QP2, and the pair of transfer MOSFETs QT1, QT2 which are formed on the SOI substrate (not illustrated).

Note that a boundary between the one memory cell MC1 and an adjacent memory cell MC1 (not illustrated) is illustrated to be divided by a chain double-dashed line. Although illustration of other memory cells MC1 is omitted in FIG. 4, the memory cells MC1 adjacent to each other in the y direction or the x direction has a symmetric layout taking the chain double-dashed line as a symmetry axis.

Each of the pair of drive MOSFETs QD1, QD2 and the pair of transfer MOSFETs QT1, QT2 is formed of an n-channel MOSFET, and each of the pair of load MOSFETs QP1, QP2 is formed of a p-channel MOSFET.

A semiconductor layer in an upper portion of the SOI substrate is partitioned into a plurality of active regions AN1, AN2, AP1, AP2 by element isolation regions (not illustrated). That is, the active regions AN1, AN2, AP1, AP2 are surrounded by the element isolation regions, and the layout of these active regions is defined by the element isolation regions. The plurality of active regions AN1, AN2, AP1, AP2 extending in the y direction are arranged so as to be aligned in the x direction. The active regions AN1, AN2, AP1, AP2 are formed of an SOI layer S1 of a chip region 1A illustrated in FIG. 6, and a semiconductor substrate SB (see FIG. 6) which is a support substrate is formed below each MOSFET illustrated in FIG. 4 via a BOX film BX (see FIG. 6).

As illustrated in FIG. 4, in the active regions AN1, AN2 having the n-channel MOSFET formed in its upper portion, a source region and a drain region are formed by introducing an n-type impurity such as P (phosphorus) or As (arsenic) into the active regions AN1, AN2. Then, a gate electrode G1 is formed via a gate insulating film (not illustrated) on the active regions AN1, AN2 between the source region and the drain region.

The gate electrode G1 extends in the x direction crossing the y direction in which each of the active regions AN1, AN2, AP1, AP2 extends. The n-channel MOSFET is formed of the gate electrode G1 formed on the active regions AN1, AN2 and of the source/drain regions each formed inside the active regions AN1, AN2 so as to sandwich the gate electrode G1 therebetween. Similarly, the p-channel MOSFET is formed of the gate electrode G1 formed on the active regions AP1, AP2 and of the source/drain regions each formed inside the active regions AP1, AP2 so as to sandwich the gate electrode G1 therebetween.

In the memory cell MC1 of the SRAM, the drive MOSFET QD1 is formed of the source region and the drain region formed in the active region AN1 and of one gate electrode G1. Also, the transfer MOSFET QT1 is formed of the source region and the drain region formed in the active region AN1 and of the other one gate electrode G1. That is, the drive MOSFET QD1 and the transfer MOSFET QT1 are formed on the same active region AN1. Similarly, the drive MOSFET QD2 and the transfer MOSFET QT2 are formed of the source region and the drain region formed in the active region AN2 and of the gate electrode G1, on the same active region AN2.

Also, the load MOSFET QP1 is formed of the source region and the drain region formed in the active region AP1 and of the gate electrode G1. Similarly, the load MOSFET QP2 is formed of the source region and the drain region formed in the active region AP2 and of the gate electrode G1.

A p-type impurity such as B (boron) is introduced into the gate electrode G1 in the load MOSFETs QP1, QP2 each of which is the p-channel MOSFET, and an n-type impurity such as P (phosphorus) or As (arsenic) is introduced into the gate electrode G1 in the transfer MOSFETs QT1, QT2 and the drive MOSFETs QD1, QD2 each of which is the n-channel MOSFET. That is, the p-type impurity such as B (boron) is introduced into the gate electrode G1 on the active regions AP1, AP2, and the n-type impurity such as P (phosphorus) or As (arsenic) is introduced into the gate electrode G1 on the active regions AN1, AN2.

Although illustration of the memory cell MC1 adjacent to the memory cell MC1 illustrated in FIG. 4 is omitted, the memory cells MC1 adjacent to each other in the x direction share the gate electrode G1 forming the transfer MOSFET QT1 or QT2. Also, the memory cells MC1 adjacent to each other in the y direction share the active regions AN1, AN2, and besides, share the active region AP1 or AP2. Note that each of the active regions AN1, AN2 has a width wider than that of each of the active regions AP1, AP2 in the x direction, that is, a gate width direction.

A contact plug CP1 is connected to the active regions AN1, AN2, AP1, AP2 and the gate electrode G1. An end of each of the active regions AP1, AP2 in the y direction is electrically connected to the gate electrode G1 by the contact plug CP1. That is, the contact plug CP1 connecting between the gate electrode G1 and the active region AP1 or AP2 is a shared contact plug. In other words, the shared contact plug is arranged so as to bridge between the gate electrode G1 and the active region AP1 or AP2.

In the foregoing, the configuration of the SRAM formed inside the SRAM region 1R inside the chip region CP illustrated in FIG. 2 has been described. Next, the TEG having an SRAM structure formed in a TEG region of the scribe line SL will be described with reference to FIG. 5. FIG. 5 is a plane layout illustrating the SRAM which is the TEG of the semiconductor device according to the present embodiment.

The element structure of SRAM illustrated in FIG. 5 is the same as the structure illustrated in FIG. 4. That is, FIG. 5 illustrates a memory cell MC2 forming the SRAM in the TEG region, that is, illustrates a second memory cell. Also, a contact plug CP2 is connected to the active regions AN1, AN2, AP1, AP2 and the gate electrode G1. However, while the SRAM described with reference to FIG. 4 is formed on the SOI substrate, the SRAM illustrated in FIG. 5 is formed on the bulk silicon substrate.

That is, while the SRAM formed inside the chip region CP (see FIG. 2) is formed on the SOI substrate, the SRAM which is the TEG formed on the scribe line SL (see FIG. 2) is formed on a semiconductor substrate exposed from the SOI layer and the BOX film. That is, each of the active regions AN1, AN2, AP1, and AP2 (see FIG. 5) forming the SRAM on the scribe line SL is formed of a semiconductor region in an upper portion inside the semiconductor substrate SB in a TEG region 1B illustrated in FIG. 6, and the BOX film BX and the SOI layer S1 (see FIG. 6) are not formed in the TEG region.

Hereinafter, with reference to FIG. 6, a difference in the SRAM between the chip region 1A and the TEG region 1B will be described by using a cross-sectional view. A cross-sectional view along a line A-A in FIG. 4 is illustrated on a left side of FIG. 6, and a cross-sectional view along a line B-B in FIG. 5 is illustrated on a right side of FIG. 6. That is, a chip area 1A of a semiconductor wafer, that is, a first region is illustrated on the left side of FIG. 6, and a TEG region 1B of the semiconductor wafer, that is, a second region is illustrated on the right side of FIG. 6. In other words, the semiconductor substrate SB illustrated in FIG. 6 has the chip region 1A and the TEG region 1B arranged on the principal surface thereof. Both of the line A-A and the line B-B are lines crossing the contact plug connected to the active regions of the MOSFET forming the SRAM.

As illustrated in FIG. 6, the semiconductor device according to the present embodiment includes an SOI substrate made of the semiconductor substrate SB which is a support substrate, the BOX film BX on the semiconductor substrate SB, and the SOI layer S1 which is a semiconductor layer on the BOX film BX. The semiconductor substrate SB has a thickness of about, for example, 500 μm to 700 μm, and is a single-crystal silicon substrate having a high resistance of, for example, 750 Ωcm or higher. The BOX film BX is made of, for example, silicon oxide, and the thickness thereof is 50 nm or smaller. Here, the thickness of the BOX film is 10 nm. The SOI layer S1 is a semiconductor layer made of, for example, single-crystal silicon having a resistance of about 1 to 10 Ωcm. The thickness of the SOI layer S1 is, for example, 20 nm which is very smaller than the thickness of the semiconductor substrate SB.

The SOI layer immediately below the gate electrode G1 of the load MOSFET QP2 illustrated in FIG. 4, that is, the silicon layer is a channel region through which a current flows when each MOSFET is driven, and a pair of source/drain regions are formed inside the SOI layer next to the gate electrode G1 so as to sandwich the channel region therebetween. Each of the pair of source/drain regions includes: an extension region which is an n-type semiconductor layer and which has a relatively low impurity concentration; and a diffusion layer which is an n-type semiconductor layer and which has a higher impurity concentration than that of the extension region. A cross-sectional structure of the MOSFET will be described later with reference to FIG. 9.

A diffusion layer D1 forming one of the pair of source/drain regions of the load MOSFET QP2 (see FIG. 4) is formed inside the SOI layer S1 in the chip region 1A in FIG. 6. Similarly, a p-type diffusion layer D1 forming one of the pair of source/drain regions of the load MOSFET QP2 (see FIG. 5) is formed in an upper portion inside the semiconductor substrate SB which is the bulk silicon substrate in the TEG region in FIG. 6. Into the diffusion layer D1, a p-type impurity (for example, B (boron)) is implanted. The diffusion layer D1 is formed inside each of the active regions AP1, AP2 illustrated in FIGS. 4 and 5.

A diffusion layer D2 (see FIG. 6) is formed inside each of the active regions AN1, AN2 illustrated in FIGS. 4 and 5. The diffusion layer D2 in the chip region 1A illustrated in FIG. 6 is an n-type semiconductor layer formed by implanting an n-type impurity (for example, P (phosphorus) or As (arsenic)) into the SOI layer S1. Also, the diffusion layer D2 in the TEG region 1B is an n-type semiconductor layer formed by implanting an n-type impurity (for example, P (phosphorus) or As (arsenic)) into the semiconductor substrate SB. The diffusion layer D2 forms the source/drain regions of the drive MOSFET QD2, and the source/drain regions include an n-type extension region (not illustrated).

Note that the load MOSFET QP1 illustrated in FIGS. 4 and 5 includes the diffusion layer D1 inside each of the active regions AP1 on both sides next to the gate electrode G1. Similarly, the load MOSFET QP2 includes the diffusion layer D1 inside each of the active regions AP2 on both sides next to the gate electrode G1.

The drive MOSFET QD1 and the transfer MOSFET QT1 illustrated in FIGS. 4 and 5 include the diffusion layer D2 inside the active region AN1 on both sides beside the gate electrode G1. Similarly, the drive MOSFET QD2 and the transfer MOSFET QT2 include the diffusion layer D2 inside the active region AN2 on both sides beside the gate electrode G1.

As illustrated in FIG. 6, in each of the chip region 1A and the TEG region 1B, the diffusion layer D1 and the diffusion layer D2 are separated from each other by an element isolation region STI. In the chip region 1A, the element isolation region STI extends from the upper surface of the SOI layer S1 so as to reach a depth in the middle of the semiconductor substrate SB. In the TEG region 1B, the element isolation region STI extends from the upper surface of the semiconductor substrate SB so as to reach a depth in the middle of the semiconductor substrate SB.

An epitaxial layer stacked by an epitaxial growth method may be formed on the SOI layer S1 in the chip region 1A and on the semiconductor substrate SB in the TEG region 1B although not illustrated. The diffusion layer D1 or the diffusion layer D2 is formed also in the epitaxial layer by implanting an n-type impurity or a p-type impurity with a high concentration thereto. Also, a silicide layer SC is formed on an upper surface of each of the diffusion layers D1, D2 and on an upper surface of the gate electrode (not illustrated). The silicide layer SC is made of, for example, CoSi (cobalt silicide).

An insulating film ES and an interlayer insulating film CL are sequentially stacked on the SOI substrate so as to cover the drive MOSFET QD2 and the transfer MOSFET QT2. In addition, a plurality of contact holes are formed so as to penetrate through the interlayer insulating film CL and the insulating film ES. The contact plug CP1 is formed inside the plurality of contact holes in the chip region 1A, and the contact plug CP2 is formed inside the plurality of contact holes in the TEG region 1B. The insulating film ES is made of, for example, silicon nitride, and functions as an etching stopper film when the contact holes are formed. The interlayer insulating film CL is made of, for example, silicon oxide, and an upper surface thereof is planarized at the same height as each height of the contact plugs CP1, CP2.

The contact plugs CP1, CP2 are cylindrical conductors having same structures as each other, and each of them is made of, for example, a barrier conductor film covering the sidewall and the bottom inside a contact hole, and of a main conductor film formed inside the contact hole via the barrier conductor film to completely bury the contact hole. The barrier conductor film contains, for example, Ti (titanium) and TiN (titanium nitride), and the main conductor film is made of, for example, W (tungsten). The contact plugs CP1, CP2 are each electrically connected to the source/drain region of each MOSFET via the silicide layer SC.

Although not illustrated, regions above the interlayer insulating film CL and the contact plugs CP1, CP2 are regions, for example, where an interlayer insulating film made of SiOC and a wire inside a wire trench penetrating through the interlayer insulating film are formed. The wire is connected to at least the contact plug CP1.

As described above, the semiconductor device according to the present embodiment includes the SRAM inside the chip region CP illustrated in FIG. 2, and also includes the TEG having an element structure of the SRAM inside the scribe line SL. The contact plug CP1 (FIGS. 4 and 6) is connected to the SRAM in the chip region CP, and the contact plug CP2 (FIGS. 5 and 6) is connected to the SRAM in the scribe line SL.

As illustrated in FIG. 6, while the SRAM in the chip region 1A is formed on an SOI substrate, the SRAM in the TEG region 1B is formed on a bulk silicon substrate. Thus, the contact plug CP1 is connected to the SOI layer S1, and the contact plug CP2 is connected to the semiconductor substrate SB.

The TEG in the present embodiment is provided to inspect a connection defect of the contact plug by the VC inspection. In order to detect defects having a risk of occurrence in the SRAM in the chip region 1A remaining in the semiconductor chip after the dicing process, the element structure of the SRAM is formed also in the TEG region 1B as similar to the chip region 1A, and the contact plug CP2 is connected to this SRAM. However, while the SRAM in the chip region 1A is formed on the SOI substrate, the SRAM in the TEG region 1B is formed on the bulk silicon substrate.

When the VC inspection is performed with the state of the formation of the interlayer insulating film CL and the contact plug CP2 on the semiconductor substrate SB, the contact plug CP2 that is normally formed so as to be connected to the semiconductor substrate SB emits light, and the contact plug CP2 that is not normally connected to the semiconductor substrate SB does not emit light. Thus, from an intensity of the contrast between the bright portion and the dark portion, it can be detected whether the defect occurs or not.

A reason why the contact plug CP2 that is normally formed so as to be connected to the semiconductor substrate SB emits light is that, in the irradiation with the electron beam in the VC inspection, light emission is generated when the electrons inside the semiconductor substrate SB having a relatively large volume flow through and are emitted to the positively-charged contact plug CP2. On the other hand, when the formation defect or others occurs due to the incomplete burying of the contact plug CP2 into the contact hole penetrating through the interlayer insulating film CL, the contact plug CP2 and the semiconductor substrate SB are not sufficiently connected to each other. Therefore, the electrons do not flow through the contact plug CP2 in the VC inspection, and the light emission does not occur, and therefore, the connection defect of the contact plug CP2 can be detected. By detecting the connection defect of the contact plug CP2 in the TEG region 1B in this manner, the occurrence of the contact defect in the contact plug CP1 in the chip region 1A can be presumed.

Regarding the above-described configuration, it can be considered to form the SRAM in the TEG region 1B on the SOI substrate as following the SRAM formed on the SOI substrate in the chip region 1A. However, if the VC inspection is performed by using the SRAM having such a configuration as the TEG, a problem described below arises.

Figure 29:
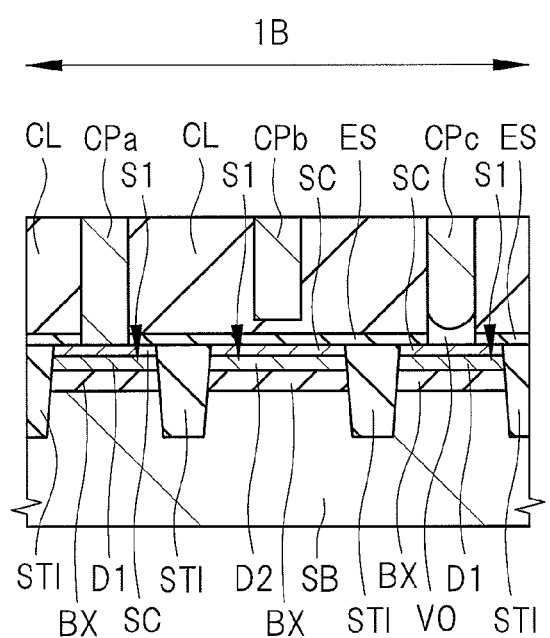
FIG. 29 is a cross-sectional view of the semiconductor device according to a comparative example.

Here, as a comparative example, FIG. 29 illustrates such a structure that the element structure of the SRAM is provided on the SOI substrate as the TEG and that a contact plug CPa is connected to the diffusion layer of the MOSFET forming the SRAM. FIG. 29 is a cross-sectional view of a semiconductor device illustrated as the comparative example, and illustrates a cross section of the same portion as the TEG region 1B in FIG. 6. As different from the present embodiment, in the TEG region 1B of the comparative example, the contact plug CPa is connected to an upper surface of the SOI substrate including the semiconductor substrate SB, the BOX film BX, and SOI layer S1.

In FIG. 29, the contact plug CPa normally connected to the SOI layer S1 is illustrated on a left side thereof, and contact plugs CPb, CPc that are not normally formed and connected to the SOI layer S1 are illustrated in a center and on a right side thereof. The diffusion layers D1, D2, and D1 are formed in the SOI layer S1 immediately below the contact plugs CPa, CPb, and CPc respectively.

As a cause of conduction defect in the contact plug, for example, a case of non-connection of the contact plug CPb inside the contact hole to the SOI layer S1 because the bottom of the contact hole does not reach the upper surface of the SOI layer S1 is considered. Also, a case of separation of the contact plug CPc from the SOI layer S1 because a void VO is formed between the contact plug CPc and the SOI layer S1 inside the contact hole is considered. As described above, open defect occur in the contact plugs CPb, CPc.

When the TEG of the comparative example is irradiated with the electron ray in the VC inspection, the electrons do not flow as similar to the above-described embodiment from the SOI substrate side to the contact plugs CPb, CPc that are not normally connected to the SOI layer S1 in the upper portion of the SOI substrate, that is, to the diffusion layer D1 or D2, and the light emission does not occur. And, in the irradiation with the electron ray in the VC inspection, the electrons inside the SOI layer S1 flow through the contact plug CPa that is normally connected to the SOI layer S1 in the upper portion of the SOI substrate, that is, to the diffusion layer D1. However, a thickness of the SOI layer S1 is very smaller than a thickness of the semiconductor substrate SB, and is separated from the other SOI layer S1 by the element isolation region STI, and therefore, has a very small volume. In addition, the SOI layer S1 is electrically insulated from the semiconductor substrate SB via the BOX film BX.

Because an amount of the electrons existing inside the thin SOI layer S1 is very smaller than an amount of the electrons inside the semiconductor substrate SB, and thus, in the irradiation with the electron ray in the VC inspection, an amount of the electrons flowing from the inside of the SOI layer S1 to the contact plug CPa is small. Thus, the intensity of the light emitted by the contact plug CPa that is normally connected to the SOI layer S1 is very low in the VC inspection, it is difficult to verify the light emission. Therefore, when the VC inspection is performed for the TEG of the comparative example, there is such a problem that the occurrence of the defects cannot be correctly detected because the light emission cannot be verified in both of the contact plugs CPb, CPc having the occurrence of the defects and the normal contact plug CPa, which results in a low contrast between the bright portion and the dark portion.

Thus, in the present embodiment, the contact plug CP2 is connected to the semiconductor substrate SB having a larger volume than the SOI layer S1. Accordingly, an amount of electrons required for verifying the light emission of the normal contact plug CP2 in the VC inspection can be flowed from the inside of the semiconductor substrate SB to the contact plug CP2. Thus, impossibility of the determination of whether any defect occurs or not due to no light emission in the VC inspection from both of the normal contact plug and the contact plug having any defect can be prevented. Therefore, in the present embodiment, by forming the SRAM in the TEG region 1B on the bulk silicon substrate as different from the chip region 1A, reliability of the semiconductor device including the TEG used for the VC inspection can be improved.

Next, the method of manufacturing the semiconductor device according to the present embodiment will be described with reference to FIGS. 7 to 13. FIGS. 7 to 13 are cross-sectional views each illustrating the steps of manufacturing the semiconductor device according to the present embodiment.

Figure 7:
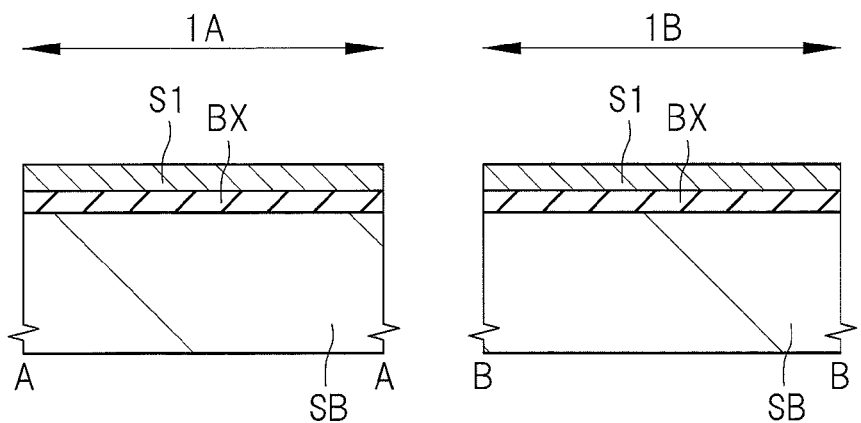
FIG. 7 is a cross-sectional view illustrating a method of manufacturing the semiconductor device as the first embodiment of the present invention.

First, as illustrated in FIG. 7, the semiconductor substrate SB whose upper portion has the BOX film BX and the SOI layer S1 sequentially stacked is prepared. The semiconductor substrate SB is a support substrate made of Si (silicon), and the BOX film BX on the semiconductor substrate SB is a silicon oxide film. The SOI layer S1 on the BOX film BX is a layer having a resistance of about 1 to 10 Ωcm and being made of single-crystal silicon, and a thickness thereof is, for example, 20 nm or smaller.

The SOI substrate made of the semiconductor substrate SB, the BOX film BX, and the SOI layer S1 includes the chip region 1A and the TEG region 1B arranged in a direction along the main surface of the semiconductor substrate SB. The chip region 1A is a region surrounded by the scribe lines SL (see FIG. 2) on the main surface of the semiconductor wafer. The TEG region 1B in the present embodiment is a region inside the scribe line SL.

The SOI substrate can be formed by a SIMOX (Silicon Implanted Oxide) method. That is, the SOI substrate can be formed by ion-implanting $O_2$ (oxygen) into the main surface of the semiconductor substrate SB made of Si (silicon) with high energy, and binding Si (silicon) with oxygen in a subsequent heat treatment, and forming a buried oxide film (BOX film) at a slightly-deeper position than the surface of the semiconductor substrate. Also, the SOI substrate can also be formed by bonding and adhering the semiconductor substrate SB whose surface has an oxide film and another semiconductor substrate made of Si (silicon) together by applying a high temperature and pressure bonding and adhering the semiconductor substrate SB, and then, the silicon layer on one side can be polished and thinned.

Figure 8:
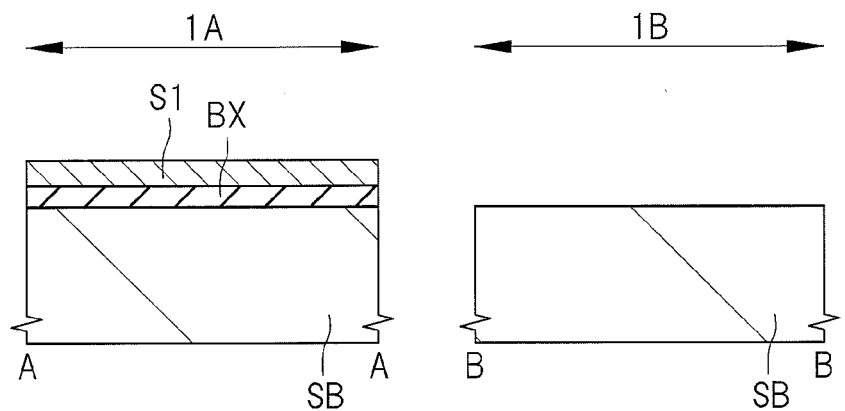
FIG. 8 is a cross-sectional view illustrating the manufacturing method of the semiconductor device, continued from FIG. 7.

Next, as illustrated in FIG. 8, the upper surface of the semiconductor substrate SB is exposed by removing the SOI layer S1 and the BOX film BX in the TEG region 1B by using photolithography technology and the etching method. Accordingly, an upper surface of the bulk silicon substrate is exposed in the TEG region 1B. Note that, in this case, the etching process is performed while the chip region 1A is covered with a resist pattern (not illustrated) and thus, the SOI layer S1 and the BOX film BX of the chip region 1A are left without being removed.

Figure 9:
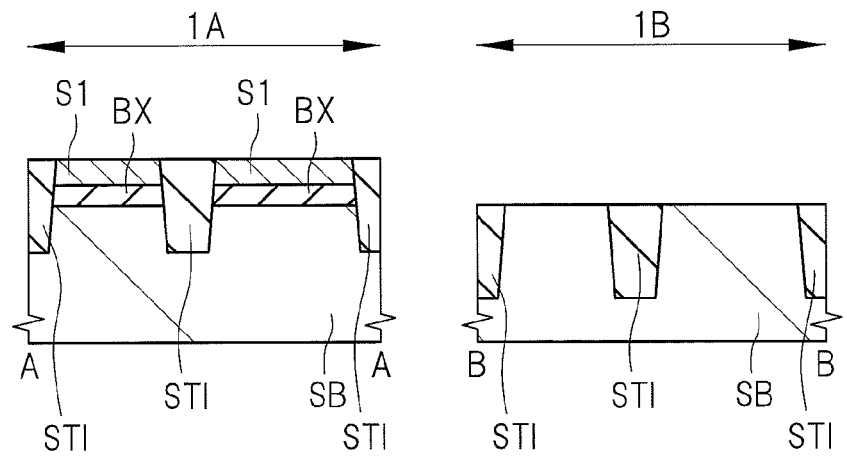
FIG. 9 is a cross-sectional view illustrating the manufacturing method of the semiconductor device, continued from FIG. 8.

Next, as illustrated in FIG. 9, a plurality of element isolation regions STI is formed by using a publicly-known method. The element isolation region STI in the chip region 1A is a trench that opens the upper surface of the SOI substrate, and is made of an insulating film buried inside a trench which is in the upper surface of the BOX film BX or which reaches a depth in the middle of the semiconductor substrate SB. The element isolation region STI in the TEG region 1B opens the upper surface of the semiconductor substrate SB, and is made of an insulating film buried inside a trench which reaches a depth in the middle of the semiconductor substrate SB. Accordingly, the structure illustrated in FIG. 9 is obtained.

Next, although not illustrated, a gate electrode is formed on the SOI layer S1 via a gate insulating film. This step will be described in detail later by using FIGS. 19 to 22. Note that a case without the formation of the epitaxial layer on the SOI layer S1 will be described here.

Figure 10:
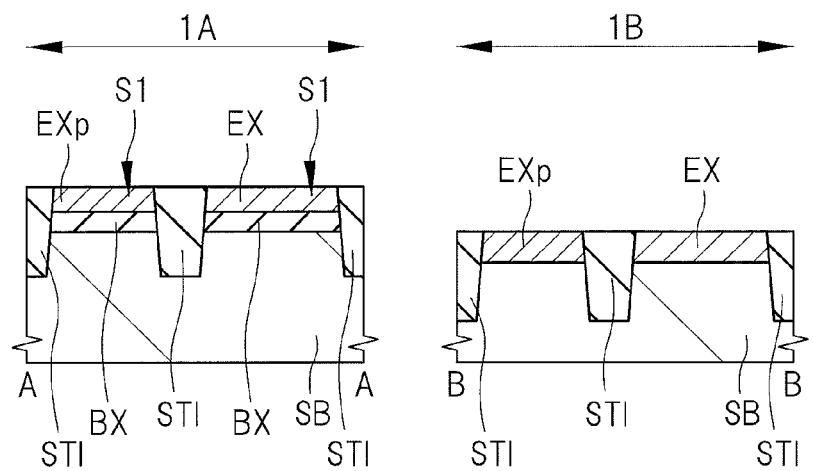
FIG. 10 is a cross-sectional view illustrating the manufacturing method of the semiconductor device, continued from FIG. 9.

Next, as illustrated in FIG. 10, an n-type impurity (for example, P (phosphorus) or As (arsenic)) with a relatively low concentration is implanted to each predetermined active region of the SOI layer S1 in the chip region 1A and the semiconductor substrate SB in the TEG region 1B by using the ion implantation method using the gate electrode (not illustrated) as a mask. Accordingly, an extension region EX is formed on each of the upper surface of the SOI layer S1 in the chip region 1A and the upper surface of the semiconductor substrate SB in the TEG region 1B exposed next to the gate electrode. The extension region EX is partially not formed on each upper surface of the SOI layer S1 and the semiconductor substrate SB immediately below the gate electrode. Also, an extension region EXp is formed on each upper surface of the SOI layer S1 and the semiconductor substrate SB in other active regions by an ion implantation method of implanting a p-type impurity (for example, B (boron)) with a relatively low concentration thereto.

The extension region EX which is an n-type semiconductor layer and the extension region EXp which is a p-type semiconductor layer are formed in different regions from each other by selectively implanting the impurity ions by using a photolithography technology.

Next, although not illustrated, a sidewall made of an insulating film covering the sidewall of the gate electrode is formed so as to be self-aligned. A step of forming the sidewall will be described in detail later by using FIGS. 20 to 24.

Figure 11:
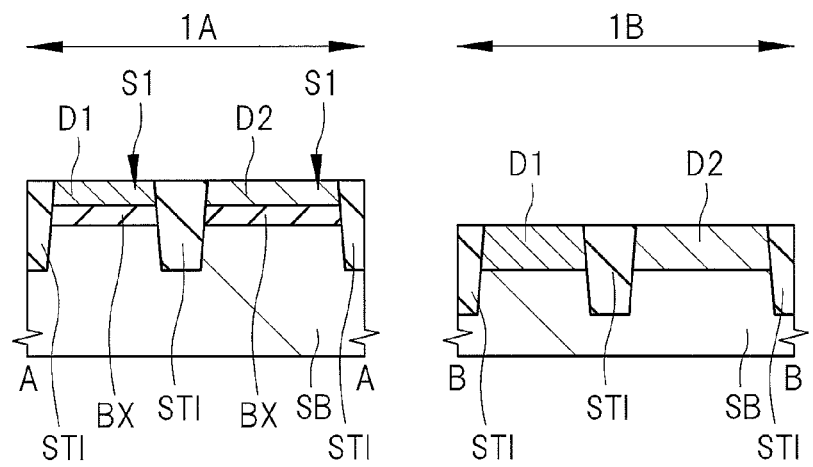
FIG. 11 is a cross-sectional view illustrating the manufacturing method of the semiconductor device, continued from FIG. 10.

Next, as illustrated in FIG. 11, the diffusion layer D2 is formed inside each of the exposed SOI layer S1 and the exposed semiconductor substrate SB by ion-implanting an n-type impurity (for example, P (phosphorus) or As (arsenic)) with a relatively high concentration from above the semiconductor substrate SB using the gate electrode (not illustrated) and the sidewall (not illustrated) as a mask. A concentration of the impurity in the diffusion layer D2 is higher than a concentration of the impurity in the extension region EX (see FIG. 10).

Also, the diffusion layer D1 is formed inside each of the exposed SOI layer S1 and the exposed semiconductor substrate SB by ion-implanting a p-type impurity (for example, B (boron)) with a relatively high concentration from above the semiconductor substrate SB using the gate electrode and the sidewall as a mask. A concentration of the impurity in the diffusion layer D1 is higher than a concentration of the impurity in the extension region EXp (see FIG. 10). The diffusion layers D1, D2 are formed in different regions from each other by selectively implanting the impurity ions thereto using the photolithography technology.

In the manner described above, the transfer MOSFET and the drive MOSFET which are the n-channel MOSFETs including the gate electrode and the source/drain regions made of the extension region EX and the diffusion layer D2 are formed. Also, in the manner described above, the p-channel load MOSFET including the gate electrode and the source/drain regions made of the extension region EXp and the diffusion layer D1 is formed. By the steps described above, the SRAM made of the plurality of MOSFETs is formed on the SOI substrate in the chip region 1A, and the SRAM made of the plurality of MOSFETs is formed as the TEG on the bulk silicon substrate in the TEG region 1B.

Figure 12:
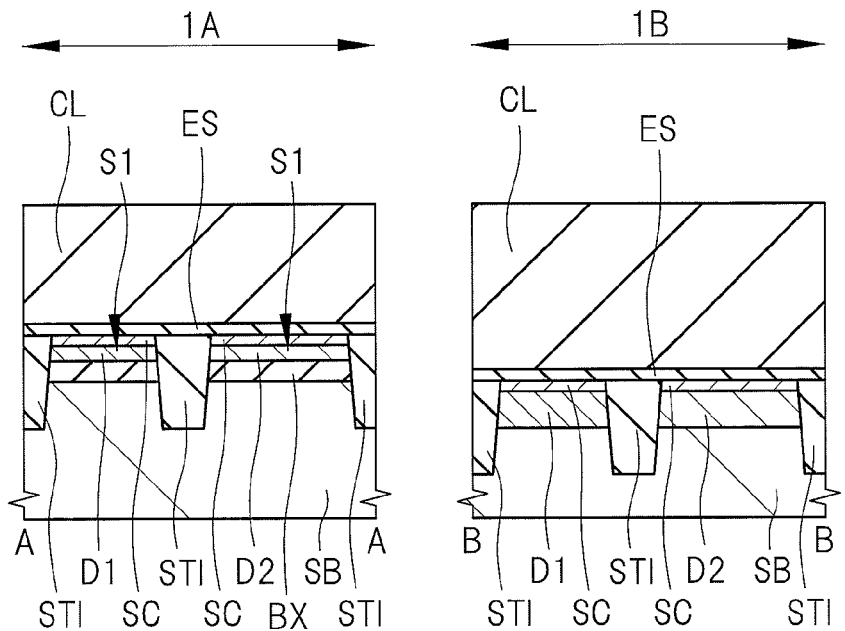
FIG. 12 is a cross-sectional view illustrating the manufacturing method of the semiconductor device, continued from FIG. 11.

Next, as illustrated in FIG. 12, the silicide layer SC is formed on each upper surface of each of the gate electrode and the SOI layer by using a publicly-known silicide technique, and then, each MOSFET is sequentially covered with the insulating film ES and the interlayer insulating film CL. The silicide layer SC is made of, for example, CoSi (cobalt silicide). The insulating film ES made of, for example, a silicon nitride film, and the interlayer insulating film CL made of, for example, a silicon oxide film, are formed by a CVD method or others. Then, an upper surface of the interlayer insulating film CL is polished by the CMP (Chemical Mechanical Polishing) method or others to be planarized.

Figure 13:
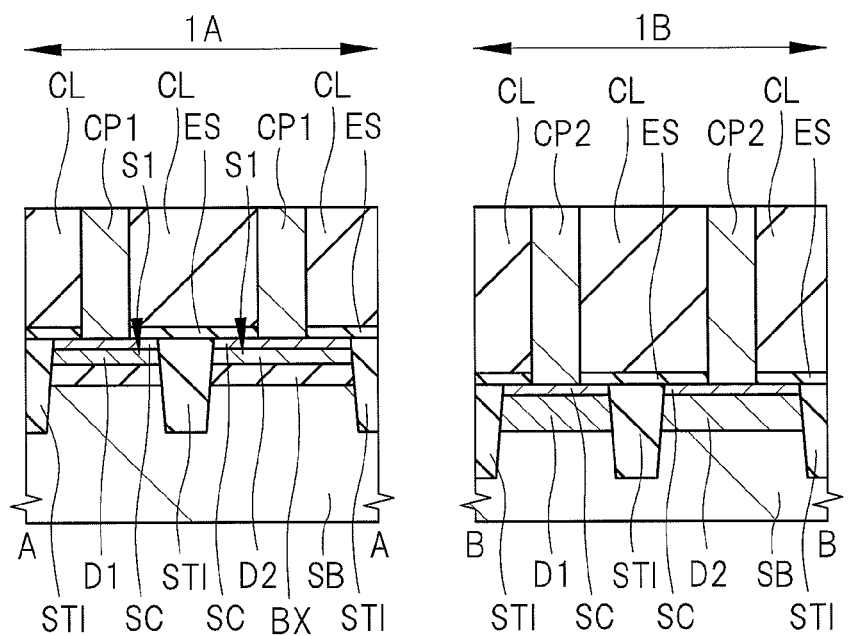
FIG. 13 is a cross-sectional view illustrating the manufacturing method of the semiconductor device, continued from FIG. 12.

Next, as illustrated in FIG. 13, a plurality of contact holes which expose the upper surface of the silicide layer SC are formed by opening the interlayer insulating film CL and the insulating film ES by using a photolithography technique and a dry etching method using the insulating film ES as an etching stopper film. Then, each contact hole is completely buried by sequentially forming a barrier conductor film containing, for example, Ti (titanium) or TiN (titanium nitride) and a main conductor film made of, for example, W (tungsten) by using, for example, a sputtering method. Subsequently, the barrier conductor film and the main conductor film are polished by, for example, the CMP method to expose the upper surface of the interlayer insulating film CL, so that the contact plugs CP1, CP2 made of the barrier conductor film and the main conductor film buried inside the plurality of contact holes are formed.

The contact plug CP1 is formed in the chip region 1A, and is electrically connected to the SOI layer S1. The contact plug CP2 is formed in the TEG region 1B, and is electrically connected to the main surface of the semiconductor substrate SB. In the manner described above, the SRAM (see FIG. 4) in the chip region 1A and the SRAM (see FIG. 5) in the TEG region 1B are completed.

The above-described VC inspection is performed immediately after the contact plugs CP1, CP2 are formed. That is, in the VC inspection, it can be detected whether the conduction defect of the contact plug formed on the semiconductor wafer occurs or not by irradiating the SRAM in the TEG region 1B including the contact plug CP2 with the electron ray.

After the above-described inspection step, a plurality of wiring layers are stacked on each of the contact plugs CP1, CP2. Subsequently, the scribe line SL (see FIG. 2) is cut out by dicing the semiconductor substrate SB, that is, the semiconductor wafer. Accordingly, a plurality of semiconductor chips including the chip region 1A is formed.

In the method of manufacturing the semiconductor device according to the present embodiment, the same effects as the effects described by using FIGS. 1 to 6 and 29 can be obtained. That is, by connecting the contact plug forming the TEG to not the upper surface of the SOI substrate but the upper surface of the bulk silicon substrate, no light emission from the normally-formed contact plug in the VC inspection as similar to the contact plug having any defect can be prevented. Accordingly, the reliability of the semiconductor device can be improved.

Figure 14:
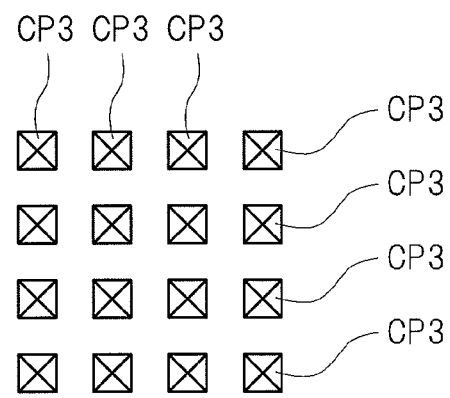
FIG. 14 is a plan view of the semiconductor device according to a modification of the first embodiment of the present invention.

Next, as a modification of the present embodiment, provision of not the element structure of the SRAM in the TEG region but a TEG in which a plurality of contact plugs are concentrated will be described by using FIG. 14. FIG. 14 is a plane layout of the semiconductor device as the modification of the present embodiment.

As illustrated in FIG. 14, the TEG formed on the scribe line SL (see FIG. 2) has a structure in which a plurality of contact plugs CP3 are connected to the upper surface of the semiconductor substrate exposed through the BOX film. The plurality of contact plugs CP3 are arranged in a matrix form when seen in a plan view. Although not illustrated, a diffusion layer may be formed on the upper surface of the semiconductor device as similar to the semiconductor device illustrated in FIG. 6.

As described above, in the semiconductor wafer having the SOI region in the chip region, the structure formed as the TEG may be not only limited to the element structure of the SRAM or others but also a structure in which the contact plug CP3 is simply connected to the bulk silicon substrate. Even in such a TEG, the effect of improving the reliability of the semiconductor device can be obtained as described above by connecting the contact plug CP3 to not the SOI layer of the SOI substrate but the bulk silicon substrate.

The step of manufacturing the semiconductor device according to the modification can be performed by the same method as that of the step described by using FIGS. 7 to 13. Note that the element isolation region may not be formed between the adjacent contact plugs. In addition, each of the extension region and the diffusion layer may not be formed.

Second Embodiment

Figure 15:
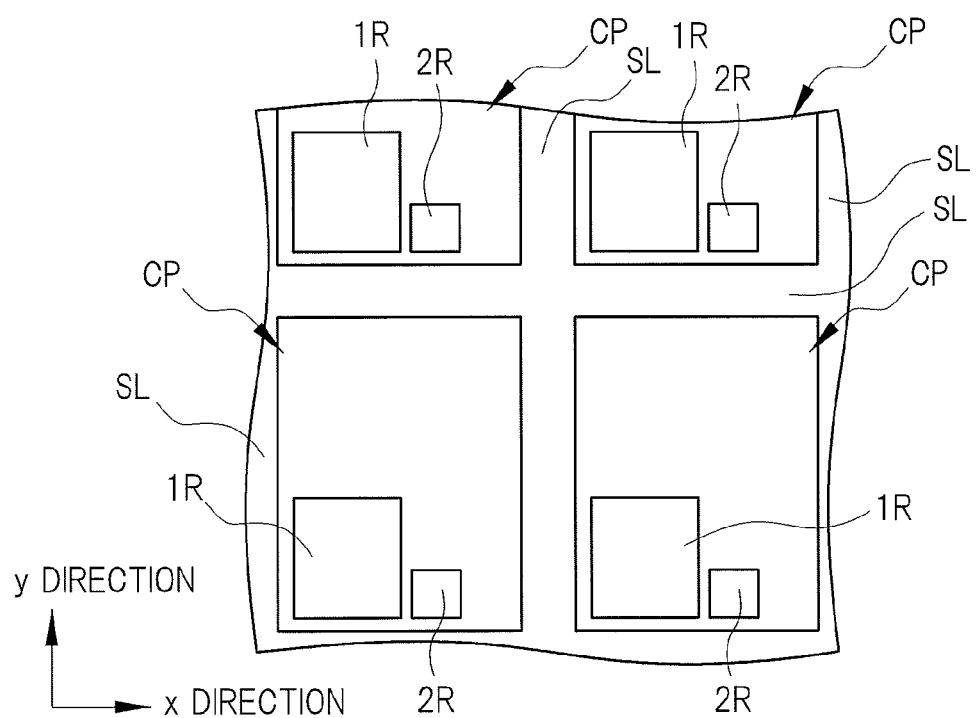
FIG. 15 is a plan view of the semiconductor device according to a second embodiment of the present invention.

Hereinafter, by using FIG. 15, explanation will be made for provision of a dummy region in the chip region including the SOI substrate, the dummy region not contributing to the operation of the semiconductor chip to be the product, and provision of the TEG used for the VC inspection on the bulk silicon substrate inside the dummy region. FIG. 15 is a plan view of the semiconductor device according to the present embodiment, and illustrates the structure in periphery of the chip region corresponding to the plan view illustrated in FIG. 2.

As illustrated in FIG. 15, the configuration in periphery of the chip region CP in the present embodiment is almost the same as that of the above-described embodiment described by using FIG. 2. Here, however, the TEG used for the VC inspection is formed inside a dummy region 2R inside the chip region CP. As similar to the first embodiment, an SRAM region 1R including the SRAM formed on the SOI substrate is provided inside the chip region CP. The SRAM region 1R and the dummy region 2R are arranged so as to be separated from each other. Inside the SRAM region 1R, the SRAM having the same structure as the structure illustrated in the chip region 1A of FIGS. 4 and 6 is formed.

On the other hand, inside the dummy region 2R, the bulk silicon substrate having the semiconductor substrate exposed from the SOI layer and the BOX film exists. On the bulk silicon substrate inside the dummy region 2R, the SRAM having the same structure as the structure illustrated in the TEG region 1B of FIGS. 5 and 6 is formed. That is, the SRAM formed inside the dummy region 2R is the TEG to be a target of the VC inspection, and is a structure body that is not used as a storage element in the semiconductor chip formed by the dicing process. The contact plug CP2 illustrated in FIGS. 5 and 6 is connected to the SRAM inside the dummy region 2R.

Even if the TEG is formed inside the chip region as similar to the present embodiment, the same effects as those in the first embodiment can be obtained. The TEG of the present embodiment is formed inside not the scribe line SL but the chip region CP, and therefore, is not removed by the dicing process but remains inside the singulated semiconductor chip.

The step of manufacturing the semiconductor device according to the present embodiment can be performed by the same method as that in the step described by using FIGS. 7 to 13. However, as described by using FIG. 15, the TEG is formed inside the chip region CP. That is, a TEG region in which the bulk silicon substrate is exposed is formed inside the chip region CP having the SOI substrate structure, and the TEG having the SRAM structure is formed inside the TEG region.

As similar to the modification of the first embodiment described by using FIG. 14, Note that the TEG formed inside the dummy region 2R may not be only limited to the element structure of the SRAM or others but may be configured by the plurality of contact plugs connected to the semiconductor substrate.

Third Embodiment

Figure 16:
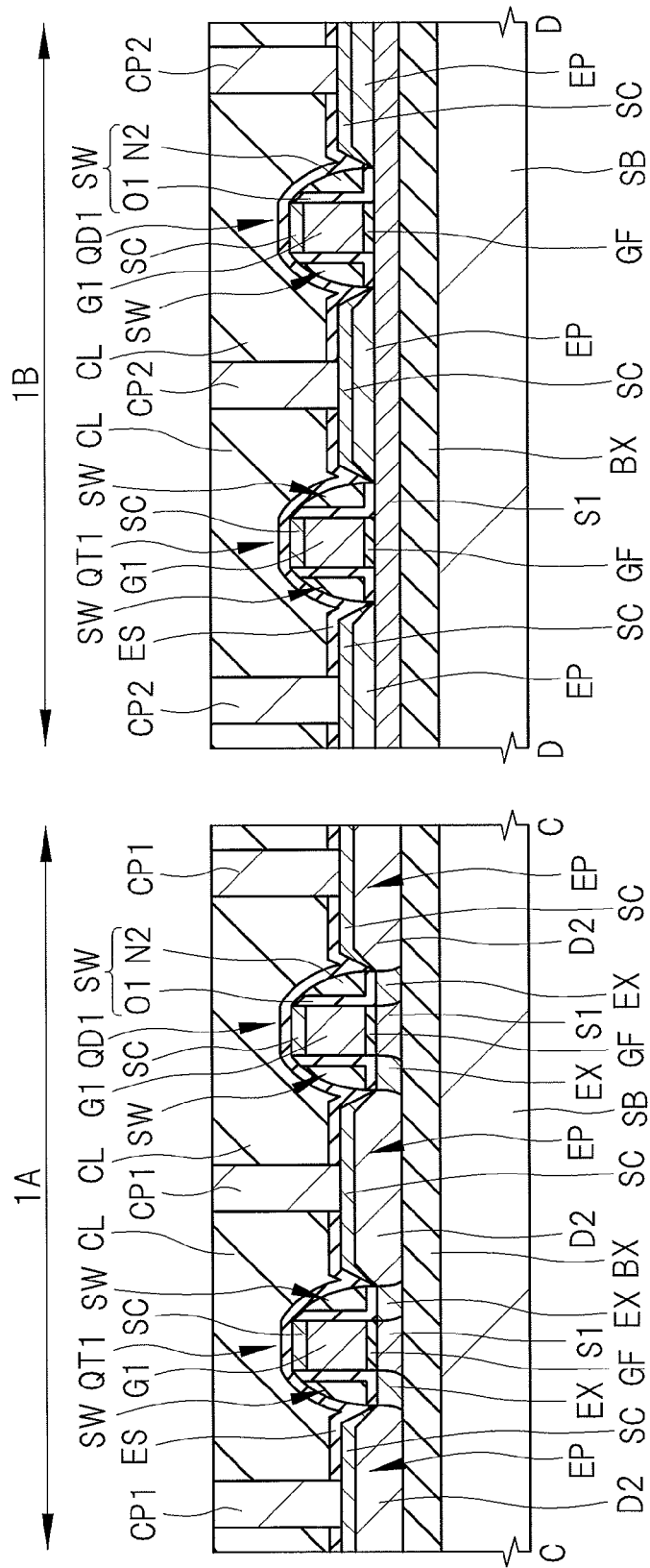
FIG. 16 is a plan view of the semiconductor device according to a third embodiment of the present invention.
Figure 17:
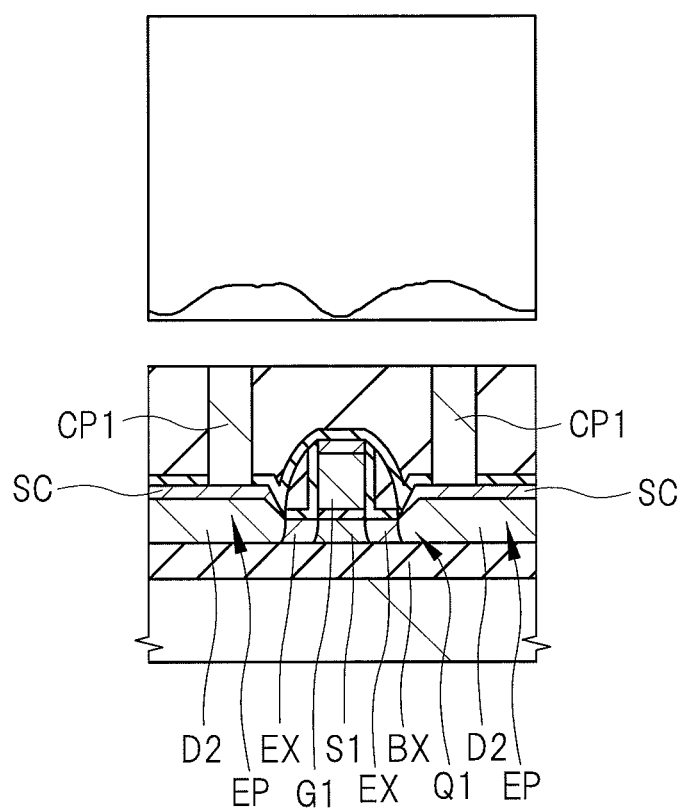
FIG. 17 is a graph illustrating emission intensity of a TEG in VC inspection and a cross-sectional view of the semiconductor device.
Figure 18:
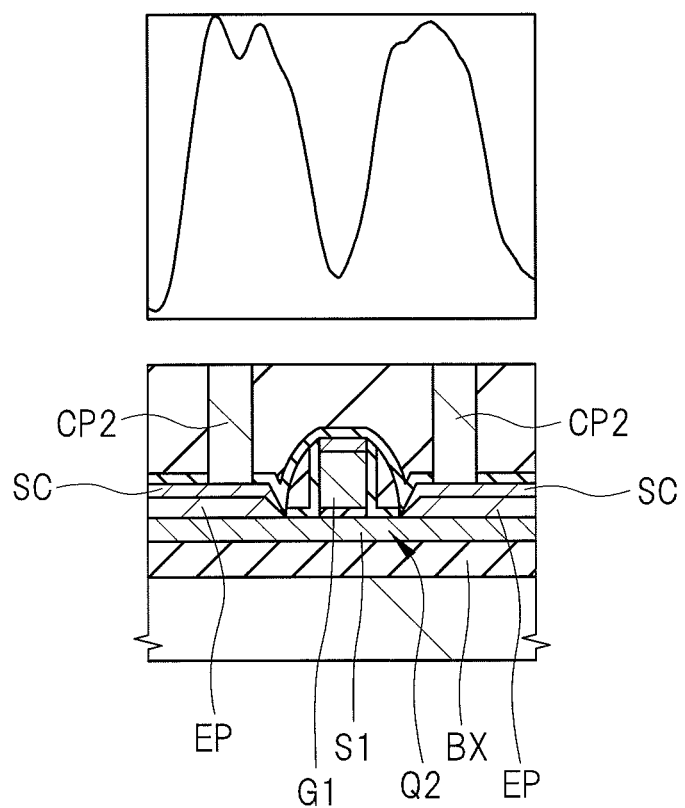
FIG. 18 is a graph and a cross-sectional view of the semiconductor device explaining an emission intensity of a TEG in VC inspection.

Hereinafter, by using FIGS. 16 to 18, explanation will be made for the improvement of the reliability of the semiconductor device by providing, on the SOI substrate, the element structure of the SRAM without the formation of the diffusion layer as the TEG used for the VC inspection. FIG. 16 is a cross-sectional view of the semiconductor device according to the present embodiment. FIGS. 17 and 18 are a graph and a cross-sectional view of the semiconductor device explaining the emission intensity of the TEG in the VC inspection.

As described by using FIGS. 1 to 5, the semiconductor device according to the present embodiment includes the SRAM region in which the SRAM is formed on the SOI substrate inside the chip region of the semiconductor wafer, and besides, the TEG used for the VC inspection having a layout of the SRAM in the scribe region of the semiconductor wafer. However, as different from the first embodiment, the SRAM forming the TEG is formed on the SOI substrate as similar to the chip region, and besides, the diffusion layer is not formed in the SRAM forming the TEG. That is, each MOSFET forming the SRAM in the TEG region does not have the source/drain regions.

Here, FIG. 16 illustrates the drive MOSFET QD1 and the transfer MOSFET QT1 forming the SRAM in the chip region 1A of the present embodiment, and the drive MOSFET QD1 forming the SRAM in the TEG region 1B thereof. A cross section of the chip region 1A which is a cross section along a line C-C in FIG. 4 is illustrated on a left side of FIG. 16, and a cross section of the TEG region 1B which is a cross section in a portion corresponding to a line D-D in FIG. 5 is illustrated on a right side of FIG. 16. The TEG region 1B is a region inside the scribe line SL (see FIG. 2).

As illustrated in FIG. 16, the semiconductor device according to the present embodiment includes the SOI substrate made of the semiconductor substrate SB, the BOX film BX, and the SOI layer S1 in each of the chip region 1A and the TEG region 1B. The semiconductor substrate SB has a thickness of about, for example, 500 μm to 700 μm, and the SOI layer S1 has a thickness of 20 nm or smaller.

The gate electrode G1 is formed on the SOI layer S1 via a gate insulating film GF in each of the chip region 1A and the TEG region 1B. The gate insulating film GF is made of, for example, silicon oxide, and the gate electrode G1 is made of, for example, a polysilicon film. The sidewall of the gate electrode G1 is covered with a sidewall SW having a stacked-layer structure of a silicon oxide film and a silicon nitride film.

In the chip region 1A, the SOI layer S1 immediately below the gate electrode G1, that is, the silicon layer is a channel region through which a current flows when each MOSFET is driven, and a pair of source/drain regions are formed inside the SOI layer S1 next to the gate electrode G1 so as to sandwich the channel region therebetween. Each of the pair of source/drain regions includes: the extension region EX which is an n-type semiconductor layer and has a relatively-low impurity concentration; and the diffusion layer D2 which is an n-type semiconductor layer and has a higher impurity concentration than the impurity concentration of the extension region EX. Thus, the source/drain regions have a LDD (Lightly Doped Drain) structure including high-concentration and low-concentration impurity diffusion regions.

To the extension region EX and the diffusion layer D2, an n-type impurity (for example, P (phosphorus) or As (arsenic)) is implanted. The extension region EX is formed in a closer region to the channel region than the diffusion layer D2. That is, a formation position of the extension region EX is closer to the gate electrode G1 than a formation position of the diffusion layer D2.

An epitaxial layer EP stacked by using the epitaxial growth method is formed on the SOI layer S1 exposed from the gate insulating film GF, the gate electrode G1, and the sidewall SW. Also into the epitaxial layer EP, a high-concentration n-type impurity is implanted to form the diffusion layer D2. Also, the silicide layer SC is formed on the upper surface of the epitaxial layer EP and the upper surface of the gate electrode G1. Here, while explanation will be made for a structure with formation of the epitaxial layer EP, the epitaxial layer EP may not be formed.

On the other hand, each MOSFET in the TEG region 1B includes the gate insulating film GF, the gate electrode G1, and the epitaxial layer EP, but does not include the extension region and the diffusion layer. That is, into the SOI layer S1 and the epitaxial layer EP in the TEG region 1B, an n-type impurity (for example, P (phosphorus) or As (arsenic)) for forming the source/drain regions are not introduced. In other words, in the TEG region 1B, neither the extension region nor the diffusion layer is formed inside the active regions of each MOSFET to which the contact plug CP2 is connected.

Note that the structure of the TEG region 1B illustrated in FIG. 16 does not include the source/drain regions, and therefore, is not configured as the MOSFET. However, for convenience, explanation will be made here so that the SRAM is formed in a state in which the drive MOSFET, transfer MOSFET, and load MOSFET not including the source/drain regions are formed in the TEG region 1B. That is, each MOSFET in the TEG region 1B is a pseudo MOSFET that is not used as the semiconductor device. Similarly, a memory cell of the SRAM formed of such MOSFETs is a pseudo memory cell that is not used to store information. That is, each of a plurality of MOSFETs in the TEG region 1B illustrated in FIG. 16 is a dummy MOSFET, and the memory cell of the SRAM including these MOSFETs is a dummy memory cell.

The insulating film ES and the interlayer insulating film CL are sequentially stacked on the SOI substrate so as to cover the drive MOSFET QD1 and the transfer MOSFET QT1. In addition, a plurality of contact holes are formed so as to penetrate through the interlayer insulating film CL and the insulating film ES, and the contact plugs CP1, CP2 are formed inside the plurality of contact holes.

The contact plug CP1 is connected to the diffusion layer D2 in the chip region 1A, and the contact plug CP2 is connected to the epitaxial layer EP in the TEG region 1B. As illustrated in FIGS. 4 and 5, note that the contact plugs CP1, CP2 are connected to other active regions and the gate electrode G1.

Here, although not illustrated, the region above the interlayer insulating film CL and the contact plugs CP1, CP2 are regions, for example, where an interlayer insulating film made of SiOC and a wire inside a wire trench penetrating through the interlayer insulating film are formed. The wire is connected to at least the contact plug CP1.

Next, the effects of the present embodiment will be described by using FIGS. 17 and 18. FIGS. 17 and 18 illustrate a cross-sectional view of the MOSFET observed in the VC inspection and a graph with correspondence of a horizontal axis to the position of the MOSFET in the gate length direction. A vertical axis in these graphs represents the light intensity detected in the VC inspection. That is, each graph in FIGS. 17 and 18 illustrates the light intensity that can be detected in periphery of the contact plug of the MOSFET in the VC inspection.

A center portion of each graph in the horizontal axis direction in FIGS. 17 and 18 corresponds to a center portion of the cross-sectional view illustrated below each graph in the horizontal direction, that is, to the position in vicinity of the gate electrode G1. Also, regions on both sides next to the center portion of each of these graphs in the horizontal axis direction correspond to formation portions of the contact plugs CP1, CP2 illustrated in the cross-sectional view below each graph.

Note that FIGS. 17 and 18 illustrate only one MOSFET. However, in the gate length direction, a plurality of MOSFETs each of which is the same as this MOSFET are formed so as to be aligned in one active region.

In the cross-sectional view of FIG. 17, the MOSFET Q1 including the source/drain regions is illustrated. The MOSFET Q1 is an n-channel MOSFET having the same structure as that of each MOSFET illustrated in the chip region 1A of FIG. 16. That is, the MOSFET Q1 is formed on the 501 substrate, and includes the diffusion layer D2 and the extension region EX. The contact plug CP1 is normally connected to the upper surface of the diffusion layer D2 via the silicide layer SC, and the graph of FIG. 17 illustrates a result of irradiation of the electron ray to such an element in the VC inspection.

When the MOSFET Q1 including the diffusion layer D2 is irradiated with the electron ray in the VC inspection as illustrated in the graph, the light intensity detected from the vicinity of the contact plug CP1 is low. Thus, it is difficult to determine whether the contact plug CP1 is normally connected to the 501 layer S1 or not by performing the VC inspection.

A reason why the emission intensity verified in the element illustrated in FIG. 17 is low as described above is the small amount of the electrons inside the SOI layer S1 because of the small volume of the SOI layer S1 as described above, and besides, the formation of the source/drain regions including the diffusion layer D2.

When the diffusion layer D2 is formed, a P-N junction is formed between the diffusion layer D2 which is an n-type semiconductor layer and the SOI layer S1 which is a p-type semiconductor layer. When the diffusion layer D2 is formed inside the thin SOI layer S1, it is difficult to form the diffusion layer D2 that does not reach the bottom of the SOI layer S1 in the upper surface of the SOI layer S1. Thus, the diffusion layer D2 reaches the bottom of the SOI layer S1, and it is considered that the channel regions of the plurality of MOSFETs aligned in the gate length direction (see FIG. 16) are separated from each other by the diffusion layer D2.

When the MOSFET Q1 illustrated in FIG. 17 is irradiated with the electron ray, electrons inside the diffusion layer D2 immediately below the contact plug CP1 flow through the contact plug CP1 so as to contribute to the light emission. However, electrons in the channel regions sandwiching the diffusion layer D2 inside the SOI layer S1 and inside the SOI layer S1 outside of these channel regions do not flow through the diffusion layer D2 and the contact plug CP1 due to the P-N junction. Thus, even if the electrons exist inside the SOI layer S1, such electrons are prevented from moving by the P-N junction on a boundary between the diffusion layer D2 and the channel regions on both sides thereof so as not to contribute to the light emission.

That is, when the diffusion layer D2 is formed, even if the normally-formed contact plug CP1 is irradiated with the electron ray, only some of the electrons inside the SOI layer S1 and the epitaxial layer EP flow through the contact plug CP1, and thus, the emission intensity is low. Therefore, when the MOSFET Q1 including the diffusion layer D2 inside the SOI substrate is used as the TEG, the contrast between the normally-formed contact plug CP1 and the contact plug CP1 having any defect becomes low, and therefore, it is difficult to determine whether the defect occurs or not, and a problem of reduction in the reliability of the semiconductor device arises.

On the other hand, FIG. 18 illustrates a cross-sectional view of the MOSFET Q2 in which the diffusion layer is not formed. The structure of the MOSFET Q2 is the same as the structure of the MOSFET Q1 illustrated in FIG. 17 except that the semiconductor layer including the diffusion layer and the extension region, that is, the source/drain regions are not formed. In other words, the MOSFET Q2 is an n-channel MOSFET having the same structure as that of each MOSFET illustrated in the TEG region 1B of FIG. 16. The contact plug CP2 is normally connected to the SOI layer S1 next to the MOSFET Q2 via the epitaxial layer EP and the silicide layer SC.

As illustrated in the graph in FIG. 18, when the MOSFET Q2 in which the diffusion layer is not formed is irradiated with the electron ray in the VC inspection, the light intensity detected from the vicinity of the contact plug CP2 is higher than that illustrated in FIG. 17. Thus, it can be easily determined whether the contact plug CP2 is normally connected to the SOI layer S1 or not by performing the VC inspection.

In the present embodiment, as illustrated in the TEG region 1B of FIG. 16, the drive MOSFET QD1 and the transfer MOSFET QT1 including no source/drain regions without forming the diffusion layer and extension region as similar to FIG. 18 are formed. Thus, in such a configuration of the MOSFET inside the SRAM forming the TEG as including no source/drain regions, more electrons can flow from the inside of the SOI layer S1 into the contact plug CP2 in the VC inspection than those in the structure described by using FIG. 17.

Accordingly, the emission intensity of the contact plug CP2 in the VC inspection can be increased and thus, the presence/absence of defects in the contact plug CP2 can easily be determined. Therefore, by realizing a semiconductor device including TEG for VC inspection illustrated in the TEG region 1B of FIG. 16, reliability of the illustrated semiconductor device can be improved.

Here, the n-channel MOSFET is taken as an example. However, even a p-channel MOSFET can be used for the VC inspection, and also the emission intensity of the contact plug in the VC inspection can be increased by forming no diffusion layer. When the p-channel MOSFET is inspected in the TEG having the element structure of the SRAM, the contact plug CP2 connected to the load MOSFET QP1 in the active region AP1 illustrated in FIG. 5 or the load MOSFET QP2 in the active region AP2 is inspected as the target of the VC inspection.

As described above, a reason why the emission intensity of the contact on the SOI substrate is low in the VC inspection is the small thickness of the SOI layer and the small volume of the same. It may be expected that the above-described problem is solved by increasing the thickness of the SOI layer. However, the increase in the thickness of the SOI layer causes reduction in a speed of an operation of an element on the SOI substrate, reduction in an integration density of an element, or others, and therefore, the increase is not realistic. Meanwhile, the volume of the SOI layer can be increased depending on patterns of the active regions.

As illustrated in FIG. 5, the active region AN1 or AN2 is larger than the active region AP1 or AP2 in a length in the y direction and in a width in the x direction. Thus, the drive MOSFETs QD1, QD2 and the transfer MOSFETs QT1, QT2 on the respective active regions AN1, AN2 are larger than the load MOSFETs QP1, QP2 in the volume of the SOI layer, and therefore, the emission intensity of the normal contact plug CP2 in the VC inspection becomes high.

In other words, the contact plug CP2 connected to the active region AN1 or AN2 has a high contrast between the dark portion and the emission portion in the VC inspection, and thus, it can be more correctly determined whether the defects occurs or not. Therefore, when the VC inspection for the TEG having the layout of the SRAM is performed, it is preferable to inspect the contact plug connected to the n-channel MOSFET forming the SRAM as the inspection target.

Next, the method of manufacturing the semiconductor device according to the present embodiment will be described by using FIGS. 19 to 27. FIGS. 19 to 27 are cross-sectional views each illustrating a step of manufacturing the semiconductor device according to the present embodiment. In FIGS. 19 to 27, as similar to FIG. 16, the chip region 1A is illustrated on a left side of each drawing, and the TEG region 1B is illustrated on a right side thereof. Note that the description of the step of manufacturing the load MOSFET which is the p-channel MOSFET is omitted here. The chip region 1A is a region inside the SRAM region 1R illustrated in FIG. 2, and the TEG region 1B is a region inside the scribe line SL illustrated in FIG. 2.

First, the same steps as the steps described by using FIGS. 7 to 9 are performed. That is, after the SOI substrate is prepared, element isolation regions are formed on the upper surface of the SOI substrate. Note that the step of exposing the bulk silicon substrate as the first embodiment is not performed.

Figure 19:
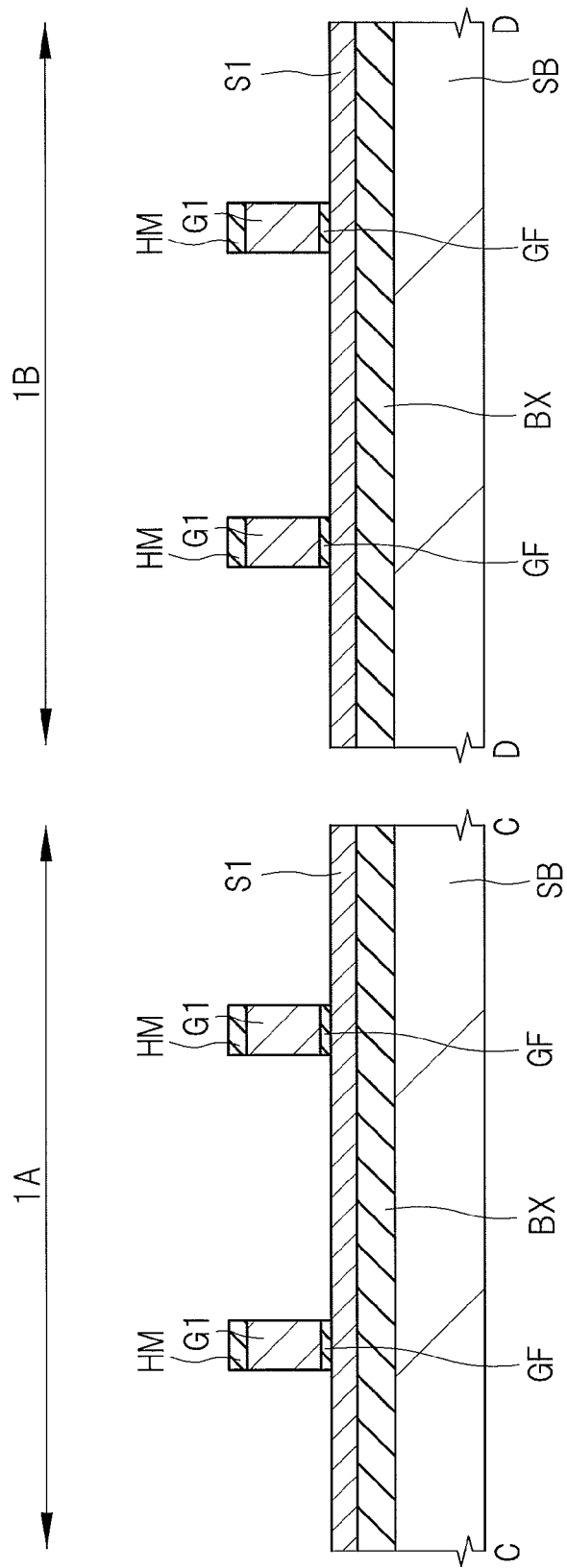
FIG. 19 is a cross-sectional view illustrating the method of manufacturing the semiconductor device according to the third embodiment of the present invention.

Next, as illustrated in FIG. 19, a silicon oxide film is formed on the SOI layer S1 by using the thermal oxidation method or the CVD method. Then, a polysilicon film and silicon nitride ($Si_3N_4$) film are sequentially formed on the silicon oxide film by using the CVD method or others, and then, the silicon nitride is patterned by using the photolithography technique and the dry etching method, so that an insulating film HM made of the silicon nitride film is formed. Subsequently, the insulating film HM is used as a hard mask to pattern the polysilicon film and the silicon oxide film by the dry etching method. In this manner, the gate insulating film GF made of the silicon oxide film is formed on the SOI layer S1, and besides, the gate electrode G1 made of the polysilicon film is formed on the gate insulating film GF.

Note that the polysilicon film forming the gate electrode G1 is formed as a low-resistance n-type semiconductor film (doped polysilicon film) by ion-implanting an n-type impurity such as P (phosphorus) or As (arsenic) thereto. Also, as a state of the polysilicon film, an amorphous silicon film in film formation can be converted into a polycrystalline silicon film by heat treatment after the film formation (after the ion implantation).

Figure 20:
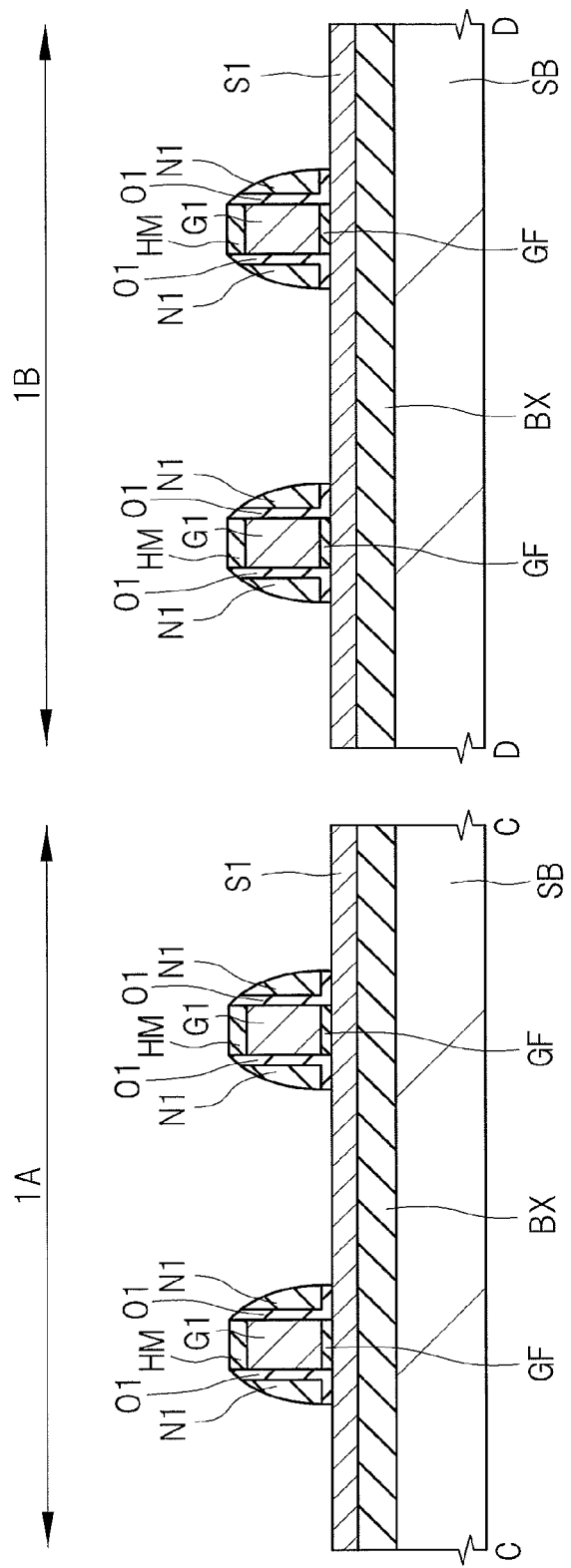
FIG. 20 is a cross-sectional view illustrating the method of manufacturing the semiconductor device, continued from FIG. 19.

Next, as illustrated in FIG. 20, a stacked film is formed by sequentially depositing a silicon oxide film O1 and a silicon nitride ($Si_3N_4$) film N1 by using, for example, the CVD method so as to cover the upper surface of the SOI layer S1, the insulating film HM, and the gate electrode G1. Then, the stacked film made of the silicon oxide film O1 and the silicon nitride film N1 is partially removed by performing anisotropic etching by the RIE (Reactive Ion Etching) method or others, so that the upper surface of the SOI layer S1 and the upper surface of the insulating film HM are exposed. In this manner, a sidewall-shaped stacked film made of the silicon oxide film O1 and the silicon nitride film N1 is formed so as to be self-aligned on the sidewall of the gate electrode G1.

Here, the silicon oxide film O1 is an insulating film for forming the sidewall, and the silicon nitride film N1 is an insulating film forming a dummy sidewall used for forming the epitaxial layer, that is, a selective growth layer, at a position separated from the gate electrode in a later step. That is, the stacked film made of the silicon oxide film O1 and the silicon nitride film N1 forms the dummy sidewall, and the silicon oxide film O1 remains but the silicon nitride N1 does not remain in the completed semiconductor device.

Figure 21:
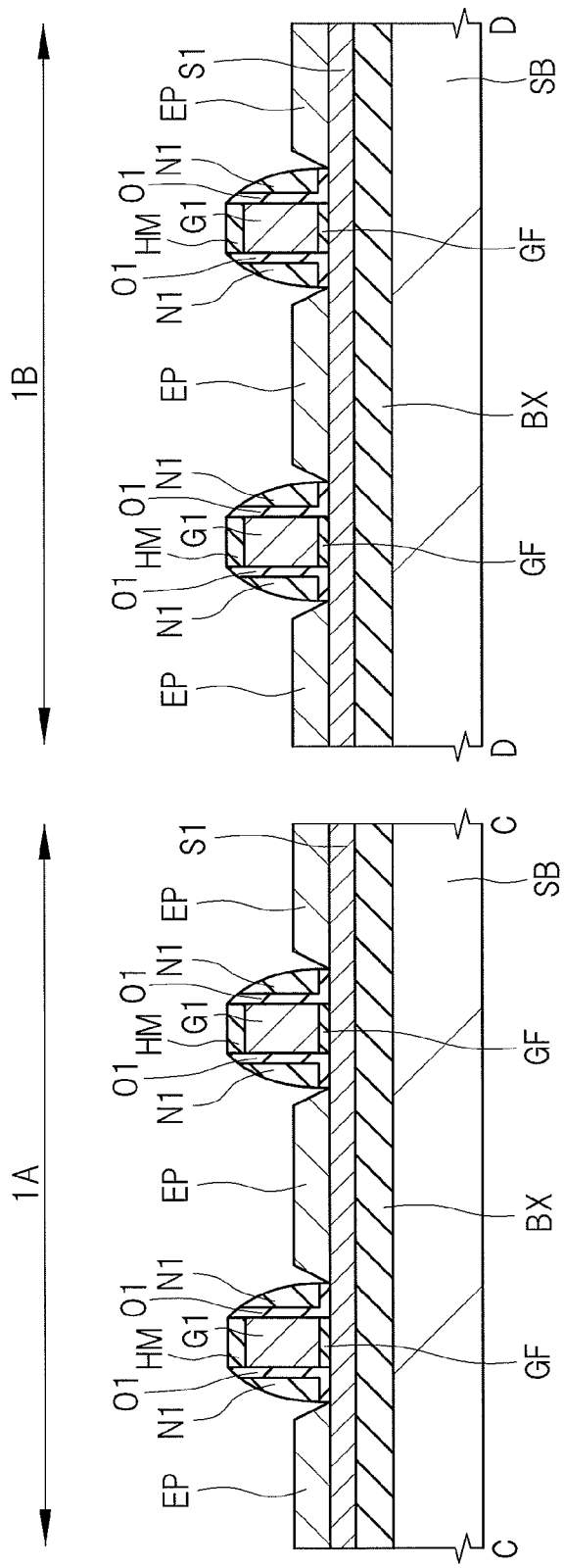
FIG. 21 is a cross-sectional view illustrating the manufacturing method of the semiconductor device, continued from FIG. 20.

Next, as illustrated in FIG. 21, the epitaxial layer EP mainly made of Si (silicon) is formed on the upper surface of the SOI layer S1 exposed from the gate electrode G1, the silicon oxide film O1, and the silicon nitride film N1 by using the epitaxial growth method. In this manner, the epitaxial layer EP which is a silicon layer having an upper surface higher than that of the SOI layer S1 is formed in a region next to the structure body including the gate electrode G1, the silicon oxide film O1, and the silicon nitride film N1 in the y direction. The epitaxial layer EP is formed with a thickness of 20 to 50 nm at a position separated from the sidewall of the gate electrode G1.

Note that the formation of the epitaxial layer EP next to the gate electrode G1 is because the thickness of the SOI layer S1 is extremely thin. That is, one reason why the epitaxial layer EP is formed is that it is required to compensate the thickness of the SOI layer S1 forming the source/drain regions when the silicide layer is formed.

Figure 22:
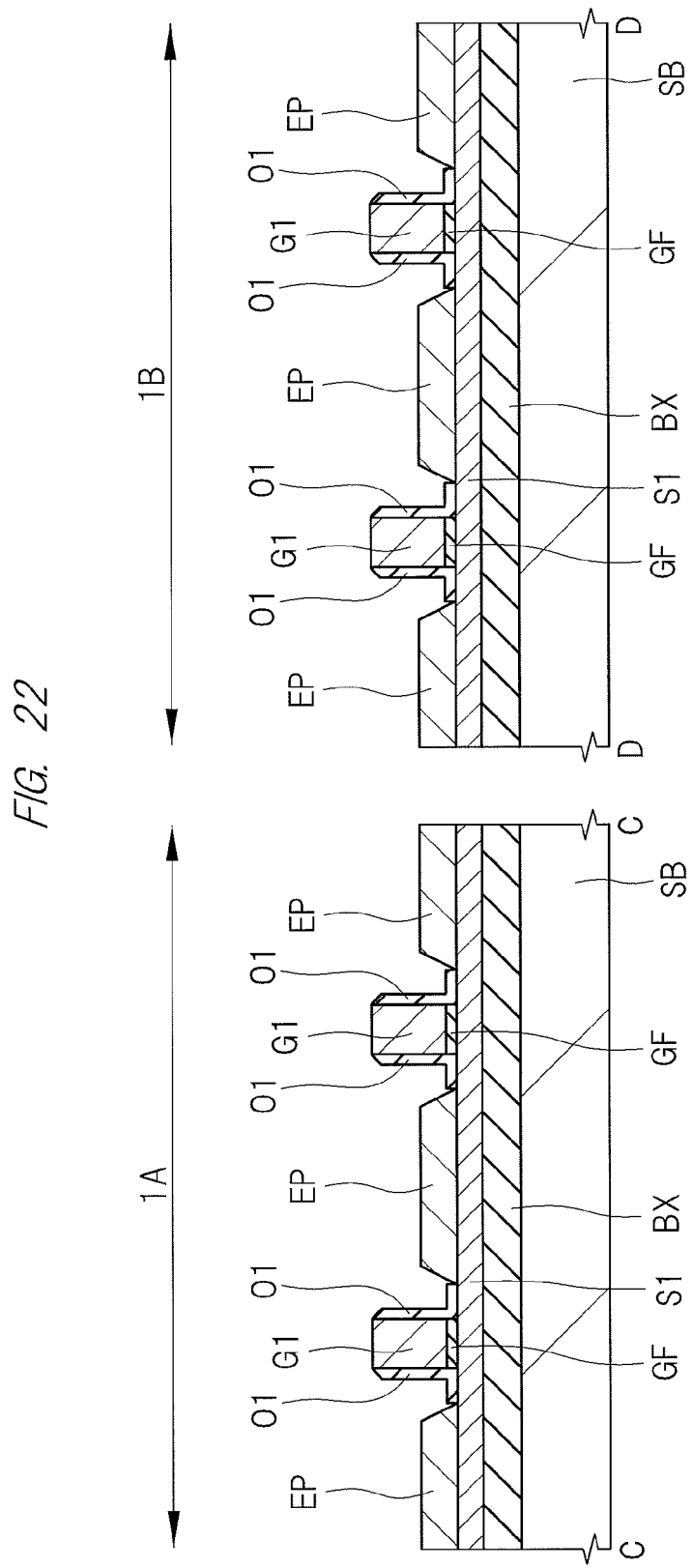
FIG. 22 is a cross-sectional view illustrating the manufacturing method of the semiconductor device, continued from FIG. 21.

Next, as illustrated in FIG. 22, the insulating film HM in an upper portion of the gate electrode G1 and the silicon nitride film N1 which is the insulating film for forming the dummy sidewall are removed by using the wet etching method.

Figure 23:
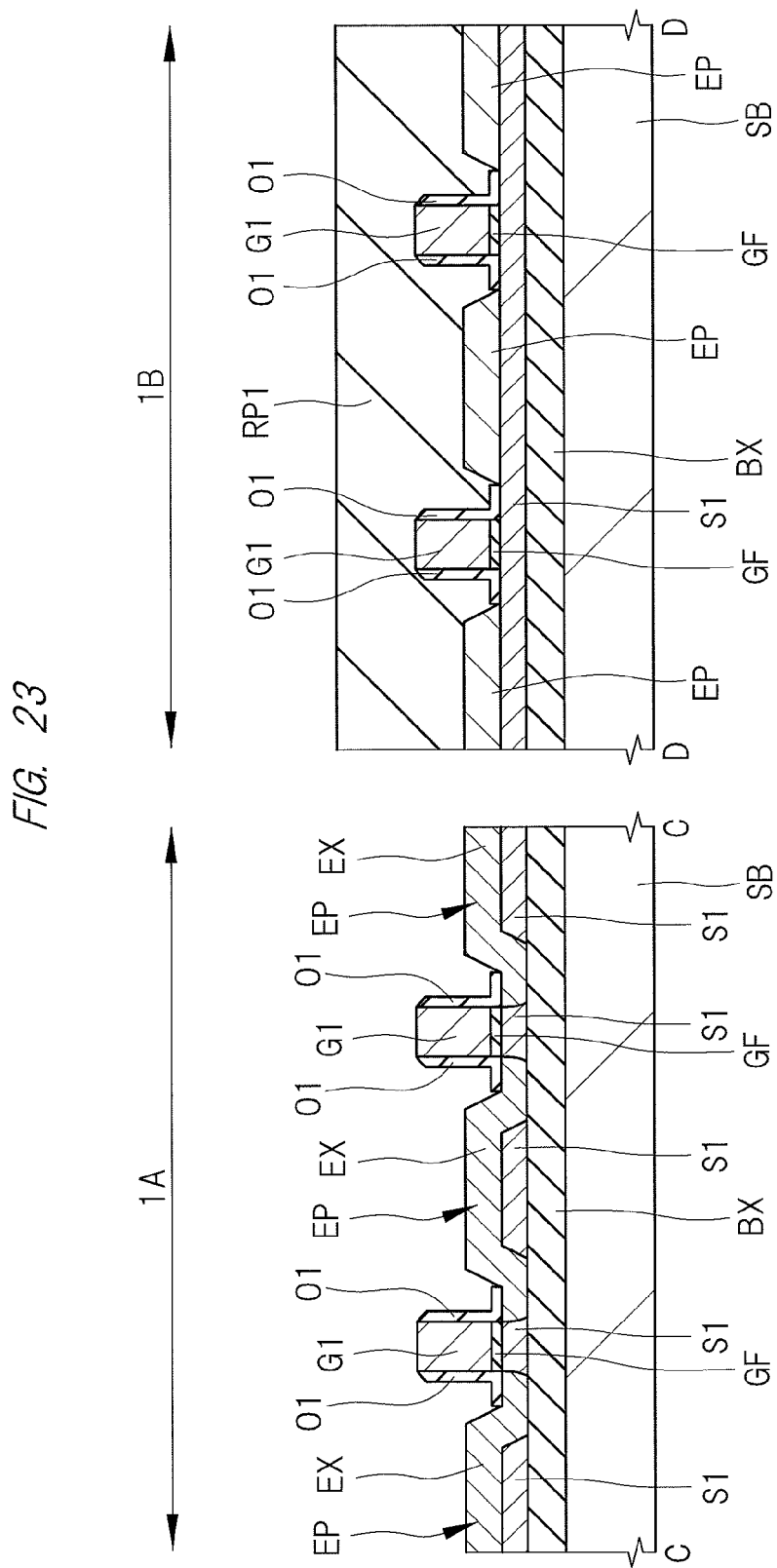
FIG. 23 is a cross-sectional view illustrating the manufacturing method of the semiconductor device, continued from FIG. 22.

Next, as illustrated in FIG. 23, a resist pattern RP1 covering the main surface of the SOI substrate in the TEG region 1B is formed by using the photolithography technique. Then, the extension region EX is formed on the upper surfaces of the SOI layer S1 and the epitaxial layer EP exposed next to the gate electrode G1 and the gate insulating film GF in the chip region 1A by implanting an n-type impurity (for example, P (phosphorus) or As (arsenic)) with relatively low concentration into the SOI layer S1 by using the ion implantation method using the resist pattern RP1 and the gate electrode G1 as a mask.

The extension region EX is not formed in a part of the upper surface of the SOI layer S1 immediately below the gate electrode G1. Further, the extension region EX is not formed inside the SOI layer S1 in the TEG region 1B.

Figure 24:
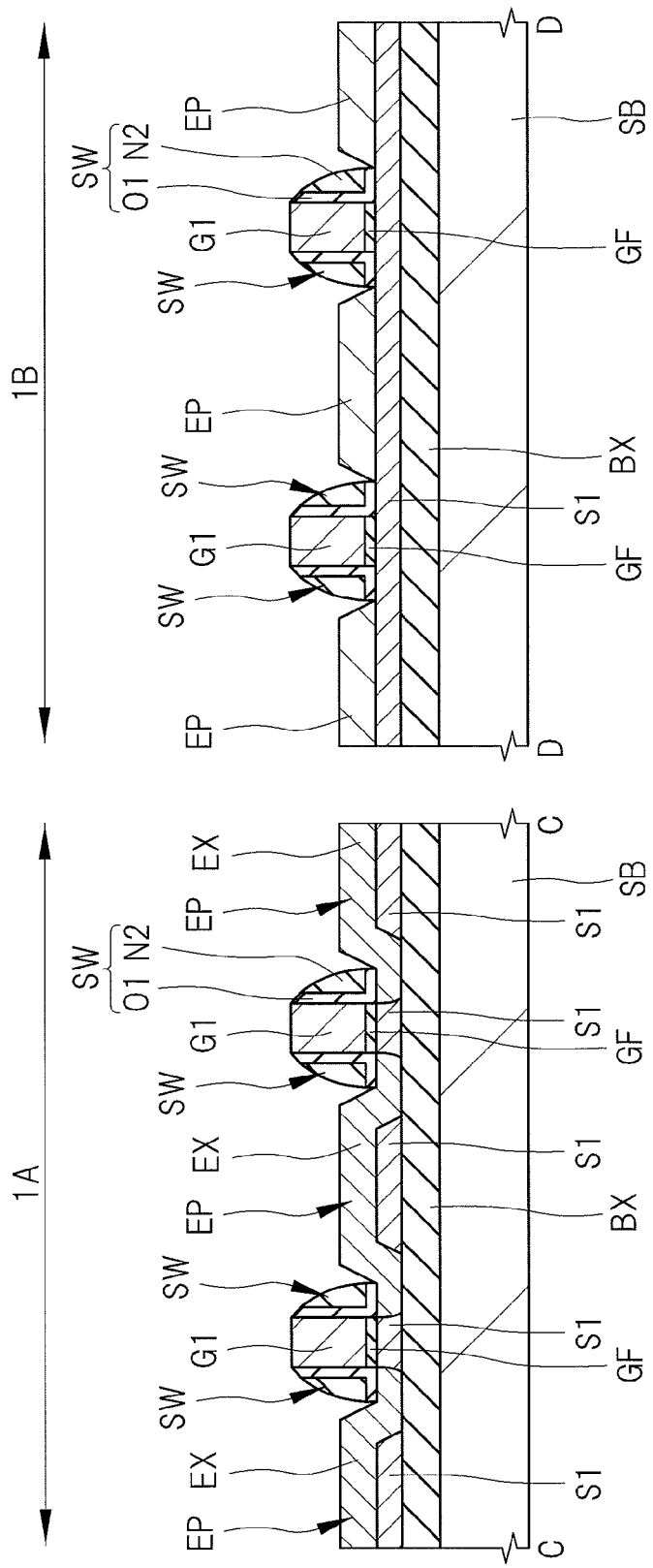
FIG. 24 is a cross-sectional view illustrating the manufacturing method of the semiconductor device, continued from FIG. 23.

Next, as illustrated in FIG. 24, after the resist pattern RP1 is removed, a silicon nitride film N2 is formed so as to cover each exposed surface of the gate electrode G1, the silicon oxide film O1, the SOI layer S1, and the epitaxial layer EP by using, for example, the CVD method. Then, the silicon nitride N2 is partially removed by performing anisotropic etching by using the RIE method or others, so that each upper surface of the gate electrode G1 and the epitaxial layer EP is exposed. In this manner, the silicon nitride film N2 is formed so as to be self-aligned on the sidewall of the gate electrode G1 via the silicon oxide film O1, and the sidewall SW made of the silicon oxide film O1 and the silicon nitride film N2 is formed.

Figure 25:
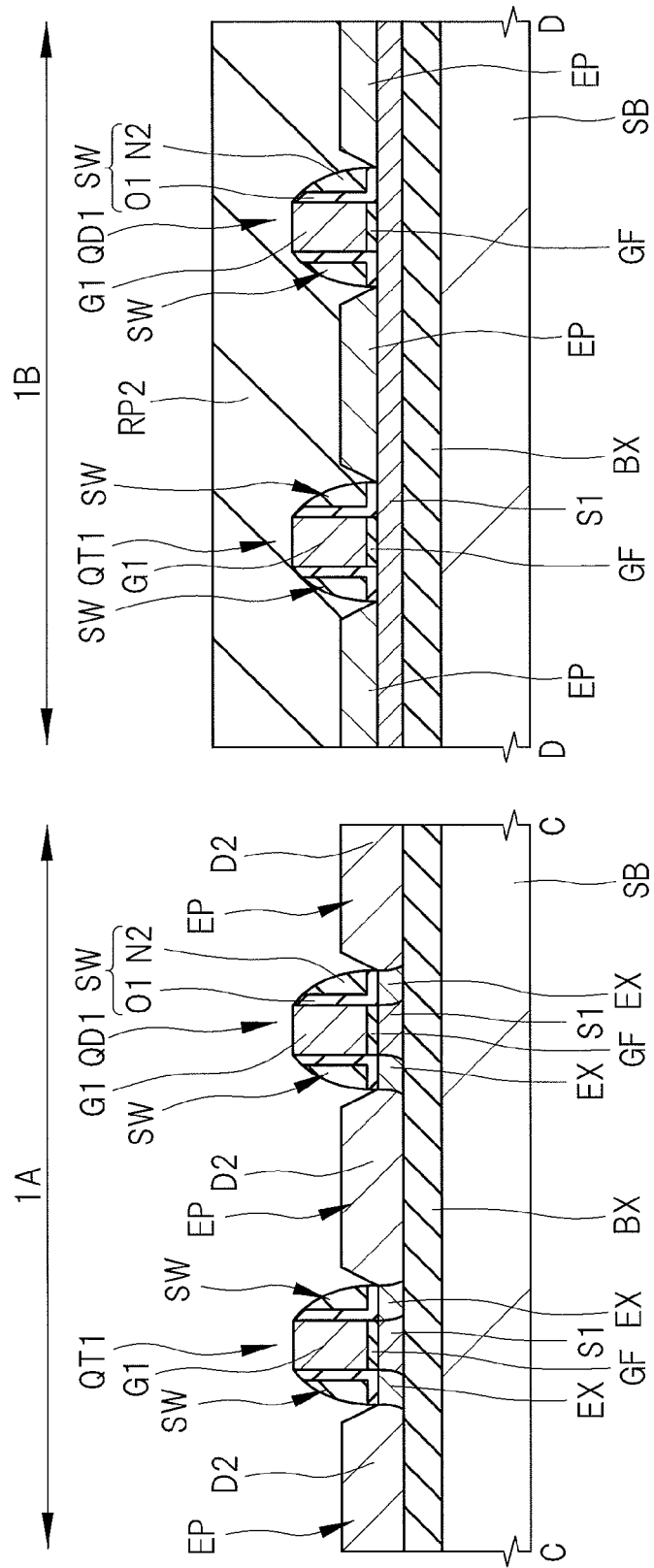
FIG. 25 is a cross-sectional view illustrating the manufacturing method of the semiconductor device, continued from FIG. 24.

Next, as illustrated in FIG. 25, a resist pattern RP2 covering the main surface of the SOI substrate in the TEG region 1B is formed by using the photolithography technique. Then, an n-type impurity (for example, P (phosphorus) or As (arsenic)) is ion-implanted with a relatively high concentration from above the semiconductor substrate SB by using the resist pattern RP2, the gate electrode G1, and the sidewall SW as a mask. In this manner, the diffusion layer D2 is formed inside the epitaxial layer EP and inside the SOI layer S1 exposed from the gate electrode G1, the silicon oxide film O1, and the silicon nitride film N2 in the chip region 1A. The extension region EX and the diffusion layer D2 are semiconductor regions forming the source/drain regions.

The source/drain regions have an LDD structure in which the extension region EX containing a low-concentration impurity is provided between the diffusion layer D2 into which an impurity is introduced with a high concentration and the SOI layer S1 to be the channel region immediately below the gate electrode G1. That is, the impurity concentration of the diffusion layer D2 is higher than the impurity concentration of the extension region EX.

In the manner described above, the transfer MOSFET QT1 and the drive MOSFET QD1 which are n-channel MOSFETs including the gate electrode G1 and the source/drain regions made of the extension region EX and the diffusion layer D2 are formed in the chip region 1A. Also in the manner described above, the transfer MOSFET QT1 and the drive MOSFET QD1 which are MOSFETs including the gate electrode G1 are formed in the TEG region 1B. Each MOSFET in the TEG region 1B does not include the source/drain regions. That is, each MOSFET in the TEG region 1B include neither the extension region nor the diffusion layer.

In other regions that are not illustrated, the p-channel load MOSFETs QP1, QP2 (see FIGS. 4 and 5) having a different conductivity type from the n-channel MOSFET are also formed. The load MOSFETs QP1, QP2 formed in the TEG region 1B do not include the source/drain regions here. With the above process, SRAM made of a plurality of MOSFETs including the source/drain regions is formed on the SOI substrate in the chip region 1A and SRAM made of a plurality of MOSFETs including no source/drain regions is formed on the SOI substrate in the TEG region 1B as TEG.

Figure 26:
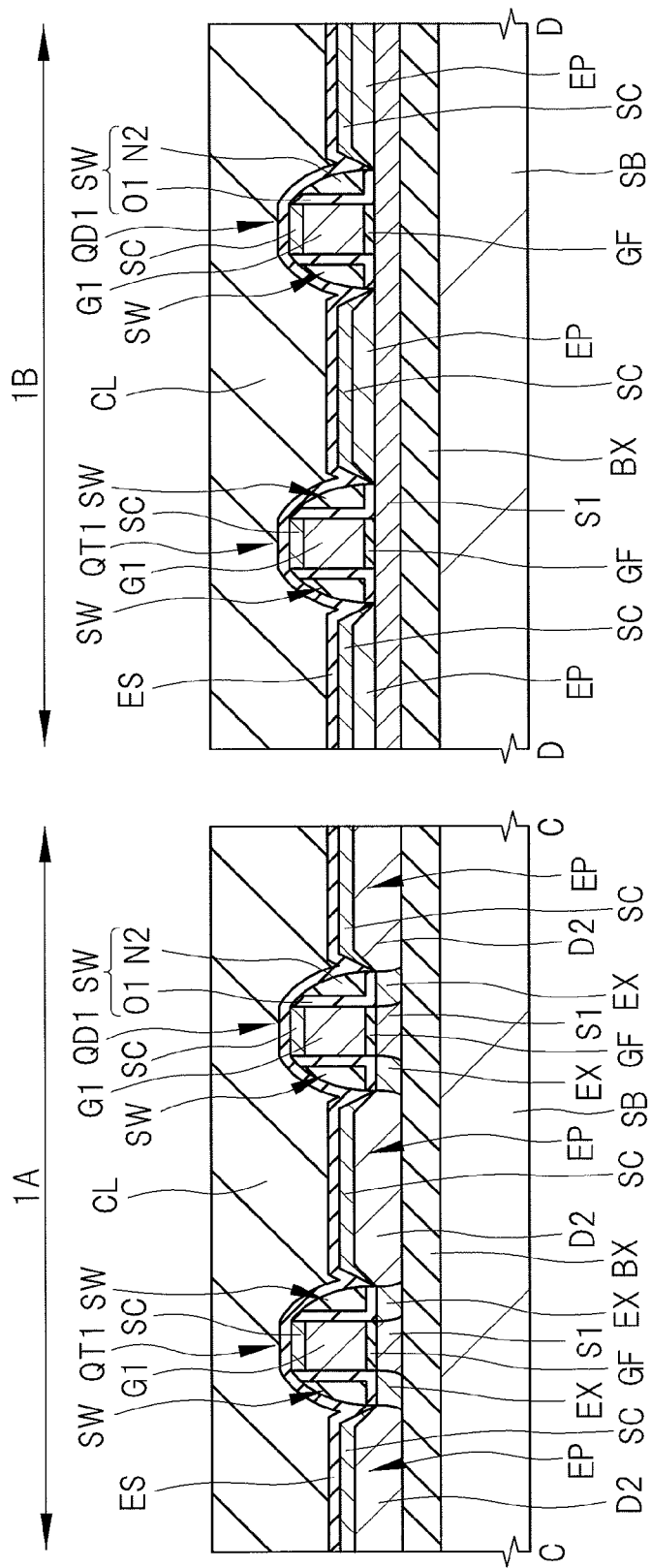
FIG. 26 is a cross-sectional view illustrating the manufacturing method of the semiconductor device, continued from FIG. 25.

Next, as illustrated in FIG. 26, after the resist pattern RP2 is removed, a stacked film made of the insulating film ES and the interlayer insulating film CL is formed by performing the step described by using FIG. 12.

Figure 27:
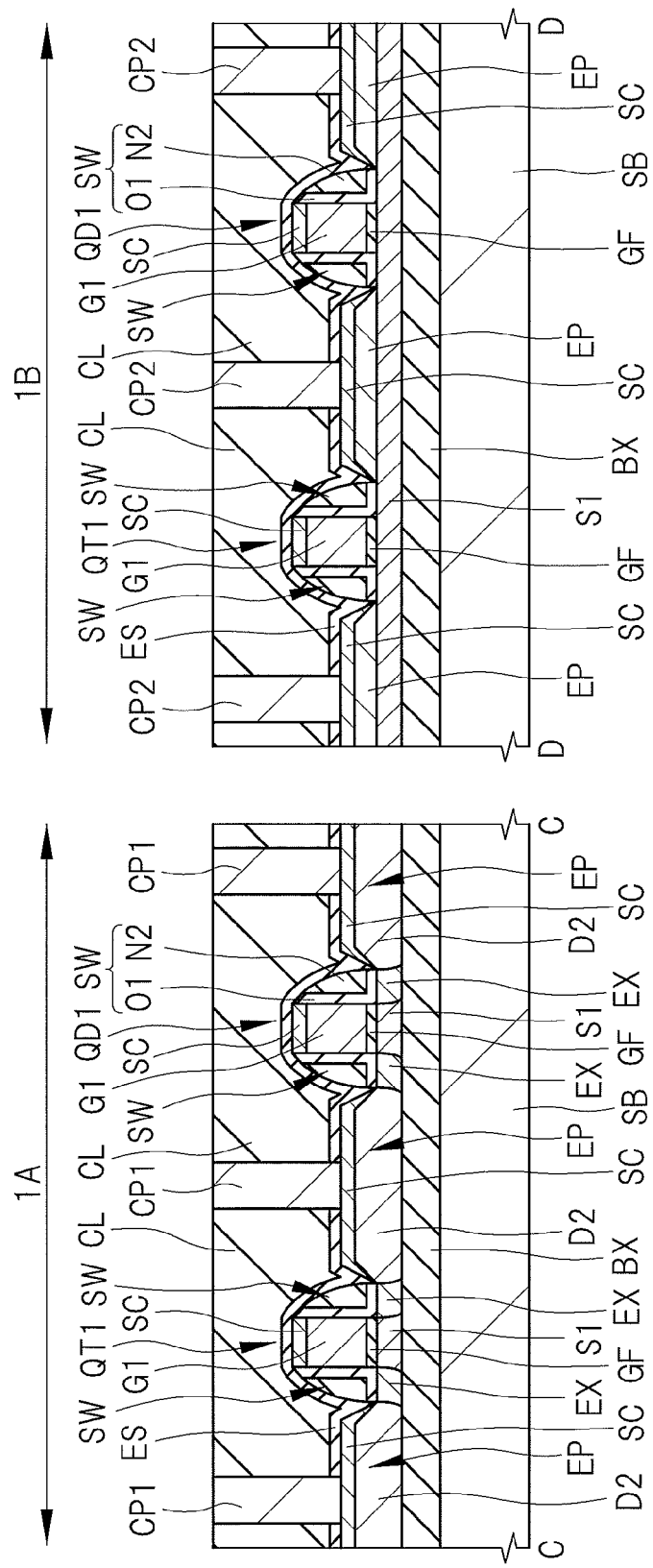
FIG. 27 is a cross-sectional view illustrating the manufacturing method of the semiconductor device, continued from FIG. 26.

Next, as illustrated in FIG. 27, a plurality of contact holes and the contact plugs CP1, CP2 buried therein are formed by performing the step described by using FIG. 13. The contact plug CP1 is connected to the epitaxial layer EP including the diffusion layer D2 in the chip region 1A, and the contact plug CP2 is connected to the epitaxial layer EP including no diffusion layer in the TEG region 1B.

Next, the VC inspection is performed for the TEG having the layout of the SRAM formed in the TEG region 1B. Then, the stacking of the wiring layer and the formation of the semiconductor chip by performing the dicing process are the same as those in the first embodiment.

In the method of manufacturing the semiconductor device according to the present embodiment, the SRAM is formed on the SOI substrate in the chip region as described above. In addition, the SRAM formed of the MOSFET including no source/drain regions is formed on the SOI substrate as the TEG inside the scribe line SL (see FIG. 2), so that a contact plug connected to the SRAM is connected. The same effects as those of the semiconductor device described by using FIGS. 16 to 18 can be obtained by performing the VC inspection for the TEG for inspecting whether the conduction defect of the contact plug occurs or not.

That is, by adopting the MOSFET forming the TEG formed on the SOI substrate so as to have a structure including neither the diffusion layer nor the extension region, electrons inside the SOI layer can be prevented from not being supplied to the contact plug due to the P-N junction in the VC inspection. Therefore, the emission intensity of the contact plug in the VC inspection can be increased, so that it can be easily determined whether the defect of the contact plug occurs or not. Thus, an accuracy of the VC inspection is improved, and therefore, the reliability of the semiconductor device can be improved.

Fourth Embodiment

Figure 28:
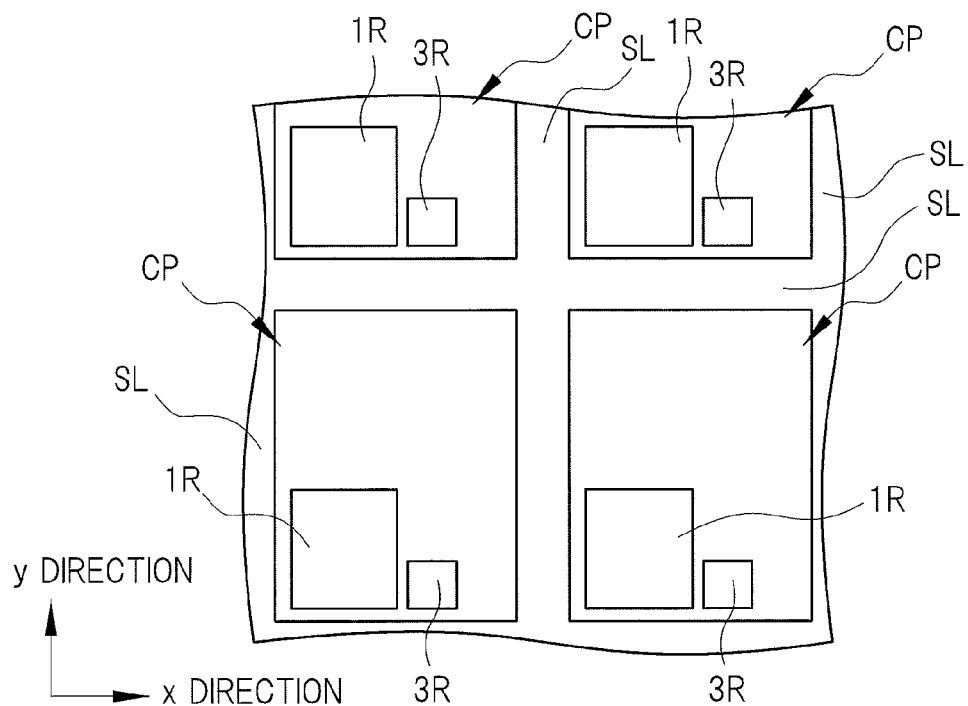
FIG. 28 is a plan view of a semiconductor device according to a fourth embodiment of the present invention.

Hereinafter, a case will be described by using FIG. 28, the case of providing a dummy region that does not contribute to the operation of the semiconductor chip to be the product in the chip region including the SOI substrate, and providing the TEG used for the VC inspection and having the MOSFET including no source/drain regions on the SOI substrate in the dummy region. FIG. 28 is a plan view of the semiconductor device according to the present embodiment, and illustrates the structure in periphery of the chip region corresponding to the plan view illustrated in FIG. 2.

As illustrated in FIG. 28, the configuration in periphery of the chip region CP in the present embodiment is almost the same as that in the above-described embodiment described by using FIG. 2. However, here, the TEG used for the VC inspection is formed inside a dummy region 3R inside the chip region CP. As similar to the third embodiment, the SRAM region 1R including the SRAM formed on the SOI substrate is provided inside the chip region CP. The SRAM region 1R and the dummy region 3R are provided so as to be separated from each other. Inside the SRAM region 1R, the SRAM having the same structure as that illustrated in the chip region 1A of FIGS. 4 and 16 is formed.

On the other hand, inside the dummy region 3R, the SRAM having the MOSFET that includes no source/drain regions is formed on the SOI substrate. That is, in the dummy region 3R, the SRAM having the same structure as that illustrated in the TEG region 1B of FIGS. 5 and 16 is formed. In other words, the SRAM formed inside the dummy region 3R is the TEG to be the target of the VC inspection, and is a structure body that is not used as the storage element in the semiconductor chip formed by the dicing process. The contact plug CP2 illustrated in FIGS. 5 and 16 is connected to the SRAM in the dummy region 3R.

Even if the TEG is formed inside the chip region CP as the present embodiment, the same effects as those in the third embodiment can be obtained. The TEG in the present embodiment is formed inside not the scribe line SL but the chip region CP, and therefore, is not removed by the dicing process, and remains inside the singulated semiconductor chip.

The steps of manufacturing the semiconductor device according to the present embodiment can be performed by the same steps as those described by using FIGS. 19 to 27. However, as described by using FIG. 15, the TEG is formed inside the chip region CP.

In the foregoing, the invention made by the present inventors has been concretely described based on the embodiments. However, it is needless to say that the present invention is not limited to the foregoing embodiments and various modifications and alterations can be made within the scope of the present invention.

For example, in the configurations of the first embodiment, its modification, and the second embodiment, the formation of the diffusion layer on the upper surface of the bulk silicon substrate connected with the contact plug forming the TEG has been described. However, as described in the third embodiment, in order to prevent the interruption of the movement of the electrons by the P-N junction, the diffusion layer is not formed on the upper surface of the bulk silicon substrate connected with the contact plug even in the configurations of the first embodiment, its modification, and the second embodiment, so that the emission intensity of the contact plug in the VC inspection may be increased.

In addition, the content described in the embodiments will be partially described below.

[Additional Remark 1]

A method of manufacturing a semiconductor device, includes: (a) a step of preparing an SOI substrate including a first region and a second region arranged on a main surface and being obtained by sequentially stacking a semiconductor substrate, a buried oxide film, and a semiconductor layer; (b) a step of forming a first memory cell having an SRAM structure on the semiconductor layer in the first region, and a second memory cell having an SRAM structure having a plurality of MOSFETs including no diffusion layer in a second active region on the semiconductor layer in the second region; and (c) a step of connecting a first contact plug to a first active region of the first memory cell and connecting a second contact plug forming a TEG used for VC inspection to the second active region of the second memory cell, and the MOSFET forming the second memory cell is a dummy MOSFET that does not include the diffusion layer in the second active region.

[Additional Remark 2]

In the method of manufacturing the semiconductor device according to the additional remark 1, the second contact plug is connected to the second active region of an n-channel MOSFET forming the second memory cell.

What is claimed is:

1. A semiconductor device comprising:
    a semiconductor substrate including a first region and a second region arranged on a main surface;
    a buried oxide film and a semiconductor layer formed sequentially on the semiconductor substrate in the first region;
    a first memory cell having a static random access memory structure formed on the semiconductor layer in the first region;
    a first contact plug connected to an upper surface of a first active region of the first memory cell;
    a second contact plug forming a test element group used for voltage contrast inspection and being connected to an upper surface of the semiconductor substrate in the second region; and
    a second memory cell having a static random access memory structure formed on the semiconductor substrate in the second region,
    wherein the second contact plug is connected to a second active region of the second memory cell, and
    wherein a metal oxide semiconductor field effect transistor of the second memory cell is a dummy metal oxide semiconductor field effect transistor including no diffusion layer in the second active region.

2. The semiconductor device according to claim 1, wherein the first region is inside a chip region, and the second region is inside a scribe line surrounding the chip region.

3. The semiconductor device according to claim 1, wherein the first region and the second region are inside a chip region surrounded by a scribe line.

* * * * *